US 8,734,666 B2

(12) United States Patent
Choi et al.

(10) Patent No.: US 8,734,666 B2
(45) Date of Patent: *May 27, 2014

(54) METHOD FOR PREPARING NANOTUBES OF PIEZOELECTRIC MATERIAL AND NANOTUBES OF PIEZOELECTRIC MATERIAL OBTAINED THEREBY

(75) Inventors: Jaeyoung Choi, Suwon-si (KR); Sangwoo Kim, Gumi-si (KR)

(73) Assignees: Samsung Electronics Co., Ltd. (KR); Kumoh National Institute of Technology (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/552,824

(22) Filed: Jul. 19, 2012

(65) Prior Publication Data
US 2012/0279942 A1    Nov. 8, 2012

Related U.S. Application Data

(63) Continuation of application No. 12/605,991, filed on Oct. 26, 2009, now Pat. No. 8,252,196.

(30) Foreign Application Priority Data

Oct. 27, 2008  (KR) .................. 10-2008-0105558

(51) Int. Cl.
*C03C 15/00* (2006.01)

(52) U.S. Cl.
USPC ........... 216/101; 438/258; 438/518; 423/160; 423/593.1; 423/594.16; 423/622

(58) Field of Classification Search
USPC ........ 216/101; 438/258, 518; 423/160, 593.1, 423/594.16, 622
See application file for complete search history.

(56) References Cited

U.S. PATENT DOCUMENTS

| 5,376,450 | A | 12/1994 | Greinke et al. |
| 7,339,184 | B2 | 3/2008 | Romano et al. |
| 7,425,487 | B2 * | 9/2008 | Kreupl et al. ................. 438/284 |
| 7,485,488 | B2 | 2/2009 | Han et al. |
| 2002/0127169 | A1 | 9/2002 | Smalley et al. |
| 2002/0168526 | A1 | 11/2002 | Mercuri et al. |
| 2006/0216222 | A1 | 9/2006 | Jang |
| 2007/0284557 | A1 | 12/2007 | Gruner et al. |
| 2008/0017100 | A1 | 1/2008 | Chyi et al. |

FOREIGN PATENT DOCUMENTS

| CN | 1884091 A | 12/2006 |
| JP | 2006512218 A | 4/2006 |
| KR | 1020050006635 A | 1/2005 |
| KR | 1020060009734 A | 2/2006 |
| KR | 1020070094292 A | 9/2007 |
| WO | 2004111319 A2 | 12/2004 |

OTHER PUBLICATIONS

Li et al. J.Phys.Chem. C (2008), vol. 112, pp. 17546-17553.*

(Continued)

*Primary Examiner* — Lan Vinh
*Assistant Examiner* — Maki Angadi
(74) *Attorney, Agent, or Firm* — Cantor Colburn LLP

(57) ABSTRACT

A method for preparing nanotubes by providing nanorods of a piezoelectric material having an asymmetric crystal structure and by further providing hydroxide ions to the nanorods to etch inner parts of the nanorods to form the nanotubes.

19 Claims, 13 Drawing Sheets

(56) References Cited

OTHER PUBLICATIONS

Kim Hanson et al. J.Mater.Res., vol. 18, No. 12, (2003), 2845-2850.*

She Guang-Wei et al. Appl.Phys. Lett. vol. 92, (2008), pp. 053111-1-053111-3.*

Yuan, X.L. et al., Cathodoluminescence characterization of ZnO nanotubes grown by MOCVD on sapphire substrate, Mater. Sci. in Semiconductor Processing, 9 (2006), pp. 146-150.

She, G-W. et al., "Controlled synthesis of oriented single-crystal ZnO nanotube arrays on transparent conductive substrates", Appl. Phys. Lett., vol. 92, (2008), pp. 05311-1 to 053111-3.

Li, L. et al., Direct Electrodeposition of ZnO Nanotube Arrays in Anodic Alumina Membranes, J. Phys. Chem. C, 2007, 111 (20), pp. 7288-7291.

She, Guangwei et al., Electrochemical/chemical synthesis of highly-oriented single-crystal ZnO nanotube arrays on transparent conductive substrates, Electrochemistry Communications 9; (2007), pp. 2784-2788.

Tang, Y. et al., Electrodeposition of ZnO nanotube arrays on TCO glass substrates, Electrochemistry Communications 9; (2007), pp. 289-292.

Yu, Q. et al., Fabrication and Optical Properties of Large-Scale ZnO Nanotube Bundles via a Simple Solution Route, J. Phys. Chem. C, 2007, 111 (47), pp. 17521-17526.

Zhang, B. P. et al., Formation of highly aligned ZnO tubes on sapphire (0001) substrates, Applied Physics Letters, 84, 2004; pp. 4098-4100.

Xu, C. X. et al., Growth and spectral analysis of ZnO nanotubes, J. of Applied Physics,103, 2008; pp. 094303-1-094303-5.

Li, H. et al., "Growth of Oriented Zinc Oxide Nanowire Array into Novel Hierarchical Structures in Aqueous Solutions", J. Phys. C, 2008, 112 pp. 17546-17553.

Fan, D. H. et al., Integration of ZnO Nanotubes with Well-Ordered Nanorods through Two-Step Thermal Evaporation Approach, J. Phys. Chem. C, 2007, 111 (26), pp. 9116-9121.

Zhang, Xianghui et al., Peculiar ZnO nanopushpins and nanotubes synthesized via simple thermal evaporation, Applied Physics Letters, 87, 2005; pp. 123111-1-123111-3.

Wei, A. et al., Stable field emission from hydrothermally grown ZnO nanotubes, Applied Physics Letters, 88, 2006; pp. 213102-1-213102-3.

Kim, H. et al., "Synthesis of hierarchical zinc oxide nanotubes", J. Mater. Res., vol. 18., No. 12, Dec. (2003), pp. 2845-2850.

Vayssieres, L. et al., Three-Dimensional Array of Highly Oriented Crystalline ZnO Microtubes, Chem. Mater., 2001, 13 (12), pp. 4395-4398.

Seo, B.I. et al., ZnO nanotubes by template wetting process, Physica E 37; (2007), pp. 241-244.

Jun Zhang, et al., "A simple route towards tubular ZnO," Chemical Communications, Jan. 23, 2002, pp. 262-263.

\* cited by examiner

METHOD FOR PREPARING NANOTUBES OF PIEZOELECTRIC MATERIAL AND NANOTUBES OF PIEZOELECTRIC MATERIAL OBTAINED THEREBY

CROSS-REFERENCE TO RELATED APPLICATION

This application is a continuation of U.S. patent application Ser. No. 12/605,991, which claims priority to Korean Patent Application No. 10-2008-0105558, filed on Oct. 27, 2008, and all the benefits accruing therefrom under U.S.C. §119, the content of which in their entirety are herein incorporated by reference.

BACKGROUND

1. Field

This disclosure relates to nanotubes comprising a piezoelectric material, a method for producing nanotubes comprising a piezoelectric material and devices including the nanotubes.

2. Description of the Related Art

Nanomaterials have electrical, physical and chemical properties that can differ from those of bulk materials. Due to such properties, nanomaterials can be used to develop nanodevices. Nanomaterials can be provided in the form of nanotubes, nanorods or the like.

Nanotubes can be prepared via a liquid phase process, an electrodeposition process, a vapor phase process, a thermal evaporation process, a template process or the like. The methods further include growing nanotubes.

SUMMARY

Nanotubes can be prepared from nanorods by selectively etching the inner parts of nanorods comprising a piezoelectric material having an asymmetric crystal structure. The inner hollow space of the nanotubes has surfaces that are formed not by growing but by etching.

An exemplary embodiment of a method for preparing nanotubes from nanorods comprising a piezoelectric material having an asymmetric crystal structure is disclosed. The method includes providing nanorods comprising a piezoelectric material having an asymmetric crystal structure and providing hydroxide ions to the nanorods to etch inner parts of the nanorods to form the nanotubes. A non-limiting example includes etching inner parts of nanorods to prepare the nanotubes by allowing the nanorods to be in contact with a basic solution. In an exemplary embodiment the basic solution is capable of generating hydroxide ions.

In another exemplary embodiment there is provided a nanotube of a piezoelectric material having an asymmetric crystal structure where the nanotube can have an etched inner surface. An inner space of the nanotube surrounded by the etched surface can be formed along a direction with a higher polarity than the other directions in the crystal structure.

The nanotubes can have an increased specific surface area as compared to non-etched nanorods, and can be applied to various industrial fields including various devices such as current generating systems, electrochromic devices, light emitting diodes ("LEDs"), solar cells, sensors, or the like.

BRIEF DESCRIPTION OF THE DRAWINGS

The above and/or other aspects, features and advantages of the disclosed exemplary embodiments will become more apparent and more readily appreciated from the following detailed description of the exemplary embodiments, taken in conjunction with the accompanying drawings of which.

DETAILED DESCRIPTION

Figure 1:
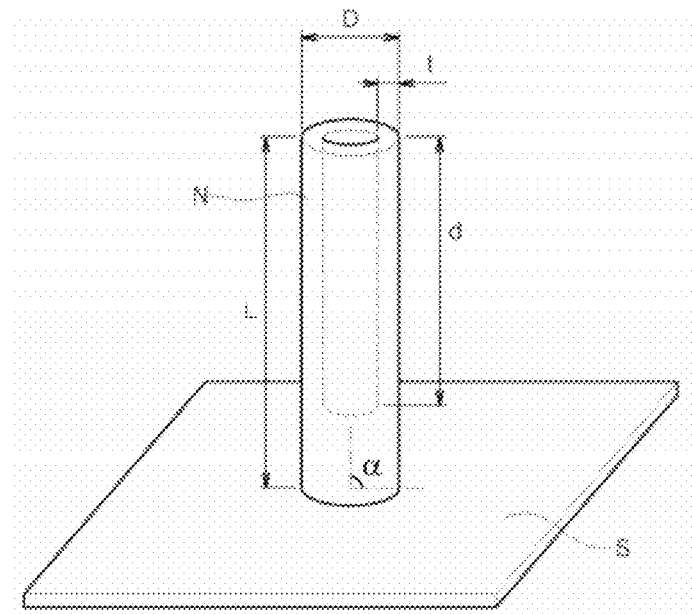
FIG. 1 is a schematic view illustrating an exemplary embodiment of a nanotube diameter, a nanotube length, a nanotube wall thickness, a nanotube depth and a nanotube angle from a substrate in the context.

This disclosure will now be described more fully hereinafter with reference to the accompanying drawings, in which exemplary embodiments are shown. The exemplary embodiments may, however, be embodied in many different forms and should not be construed as limited to the exemplary embodiments set forth herein. Rather, these exemplary embodiments are provided so that this disclosure will be thorough and complete, and will fully convey the scope of the claims to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings herein.

The terminology used herein is for the purpose of describing particular embodiments only and is not intended to limit the claims. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments of the present disclosure. As such, variations from the shapes of the illustrations as a result, for example, of manufacturing techniques and/or tolerances, are to be expected. Thus, embodiments of the present disclosure should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the exemplary embodiments of this disclosure will be described in detail with reference to the accompanying drawings.

All methods described herein can be performed in a suitable order unless otherwise indicated herein or otherwise clearly contradicted by context. The use of any and all examples, or exemplary language (e.g., "such as"), is intended merely for illustration and does not pose a limitation on the scope of the claims unless otherwise claimed. No language in the specification should be construed as indicating that any non-claimed element is essential.

The term "nanotube" as used herein means a hollow tube-shaped nanomaterial having a diameter (e.g., several nanometers to several thousands nanometers) and a length (e.g., several nanometers to several micrometers). The nanotube is partly or totally hollow along the longitudinal direction thereof. The length of the hollow portion of the nanotube is defined as a nanotube depth (i.e., inner depth of the nanotube).

The term "nanorod" as used herein means a rod-shaped nanomaterial having a diameter (e.g., several nanometers to several thousands nanometers) and a length (e.g., several nanometers to several micrometers).

The term "external characteristics" as used herein refers to the external characteristics of the nanorods or nanotubes. Such external characteristics can include: a diameter of the nanorods or nanotubes; a length of the nanorods or nanotubes; an aspect ratio (ratio of length to diameter, i.e., L/D ratio) of the nanorods or nanotubes; an angle of the nanotubes or nanorods relative to a substrate (also referred to herein as "orientation"); a number or weight ratio of the nanotubes or nanorods per unit area of a substrate (also defined as "density"); a density of the nanotubes or nanorods with a specific orientation; an uniformity in shapes or orientations among the nanotubes or nanorods (also referred to herein as "uniformity"); or whether one nanotube or nanorod stands on one contact surface between the nanorod or nanotube and a substrate.

The term "internal characteristics" can include properties such as a wall thickness of nanotubes, an inner depth of nanotubes or a shape of the inner etched surfaces of the nanotubes.

The term "substrate" as used herein means a material having a surface, for example a plate-like material having a surface on which the nanorods or nanotubes can stand. The substrate can include at least one material. As a non-limiting example, the substrate can have a multi-layer structure having a coating layer. Where substrate has a catalyst layer or a seed layer formed on the surface thereof, the term "substrate" includes the catalyst layer or seed layer.

FIG. 1 is a schematic view illustrating an exemplary embodiment of nanotube diameter, nanotube length, nanotube wall thickness, nanotube depth and nanotube angle from a substrate. It can be appreciated by those skilled in the art that FIG. 1 shows a configuration of a nanotube for purposes of illustration only, and the nanotube in FIG. 1 may not reflect the actual configuration and/or relative proportions of the nanotubes described herein.

Referring to FIG. 1, a nanotube N can stand on a contact surface of a substrate S where the substrate S is in contact with the nanotube N. Herein, the nanotube N can have a diameter D, a length L, an aspect ratio L/D, an angle α to the substrate S, a wall thickness t and a depth d of an interior void within the nanotube N. D can be from about 30 nanometers (nm) to about 1 micrometer, or from about 100 nm to about 0.5 micrometers, L can be from about 100 nm to about 4 micrometers or from about 200 nm to about 2 micrometers, L/D can be from about 1.25 to about 80 or from about 5 to about 50, α can be from about 20° to about 90° or from about 40° to about 90° and t can be from about 2 nm to about 200 nm or from about 10 nm to about 100 nm.

In various non-limiting exemplary embodiments, nanotubes comprising a piezoelectric material having an asymmetric crystal structure can be obtained by selectively etching all or a portion of one or more inner surfaces of nanorods comprising the piezoelectric material having the asymmetric crystal structure. The method of preparing the nanotubes is performed by etching the nanorods and not by growing the nanotubes. Therefore, the inner voids of the obtained nanotubes have surfaces formed not by growing but by etching.

"Piezoelectric effect" as used herein refers to an effect of converting electrical energy into mechanical energy and vice versa. Further, a "piezoelectric material" as used herein refers to a material having such a piezoelectric effect.

Piezoelectricity can result from an asymmetry of the crystal structure of a piezoelectric material. For example, if there are three axes in the crystal structure, e.g., an a-axis, a b-axis and a c-axis, and a stronger polarity exists along the c-axis compared to the a- or b-axis, piezoelectricity can occur. For reference, the asymmetric crystal structure refers to a crystal structure where atoms are asymmetrically arranged from an arbitrary axis located on the center of the structure. For example, ZnO basically is of a hexagonal crystal structure. However, since $Zn^+$ ions and $O^-$ ions having different sizes are sequentially arranged along with the C-axis direction, ZnO has an asymmetric wurtzite crystal structure. When strain is applied to the asymmetric crystal structure, ions in the asymmetric crystal structure gather together in a specific direction, and to this end, the asymmetric crystal structure shows piezoelectricity. Wurtzite or perovskite structure is an example of the asymmetric crystal structure which can show the piezoelectricity.

Without being bound by theory, it is believed that hydroxide ions, for example, hydroxide ions in a basic solution can attack (and can react with) a specific portion of the nanorods (e.g., portions along with c-axis or longitudinal direction) with higher frequency than other portions in the asymmetric crystal structure of the piezoelectric material.

Specifically, it is believed that when hydroxide ions are provided to a piezoelectric material having, for example, a stronger polarity in a specific direction of the crystal structure of the piezoelectric material, a higher etching rate can be obtained along the specific direction having the stronger polarity than can be obtained along the other directions of the crystal structure of the piezoelectric material. Therefore, as used herein, the term, "selective etching" means etching that occurs in a specific direction resulting from the difference in etching rates in the crystal structure of the piezoelectric material. It will be appreciated by those skilled in the art that selective etching can be distinguished from etching using a difference in etching rates between two or more different materials, in that the selective etching can occur in nanorods made of a single piezoelectric material. The selective etching can take place through the contact with acidic materials without using basic solutions. For example, the selective etching can take place in the acidic solution if the etching conditions of hydroxide ion concentration, etching temperature and etching time in the case of using acidic solution are the same with those in the case of using basic solution.

In sum, when hydroxide ions are provided to nanorods comprising a piezoelectric material having an asymmetric crystal structure, such that the hydroxide ions are in contact with the piezoelectric material (for example, by contacting the nanorods with a basic solution), selective etching can occur in a specific direction due to the attack of the hydroxide ions. As a result, partially or completely hollow nanotubes, i.e., nanotubes having inner surfaces that are partially or completely etched, can be produced.

Therefore, in a non-limiting exemplary embodiment, a method for preparing nanotubes from nanorods comprising a piezoelectric material having an asymmetric crystal structure can include providing hydroxide ions to the nanorods to etch the inner parts of the nanorods to provide a nanotube having an interior void. In a non-limiting example, the nanorods comprising a piezoelectric material having an asymmetric crystal structure can be in contact with a basic solution for etching the inner surfaces of the nanorods to produce nanotubes from the nanorods. Further, the method can include: forming nanorods comprising a piezoelectric material having an asymmetric crystal structure on a substrate, and contacting the nanorods with a basic solution in order to etch the inner parts of the nanorods, thereby providing nanotubes having interior voids from the nanorods. The substrate can optionally be removed from the nanotubes formed on the substrate to obtain only the nanotubes after the etching. Though the above-described exemplary method for preparing nanotubes from nanotubes includes forming nanorods, the method for preparing nanotubes is not be limited to require forming nanorods. In other non-limiting exemplary embodiments of the method for preparing nanotubes from nanorods, the nanotubes can also be obtained by etching the inner parts of ready-made nanorods.

In an exemplary embodiment, nanorods comprising a piezoelectric material having an asymmetric crystal structure, and which are subsequently etched to provide nanotubes, can be formed on a substrate as follows. In this regard, it will be appreciated by those skilled in the art that a variety of methods for forming nanorods can be used, and the methods for forming nanorods described hereinafter is not intended to limit the method for preparing nanotubes from nanorods according to the exemplary embodiments.

Non-limiting examples of processes for forming nanorods include a liquid phase process, a vapor phase process, a vapor-liquid phase growing process, a template process or the like or a combination thereof, which can be used alone or in combination. The liquid phase process, vapor phase process and vapor-liquid phase growing process can include growing nanorods on a substrate by using nanonuclei (i.e., nanoseeds) or catalysts and reactants in a liquid or vapor state. The template process can include forming a patterned catalyst on a substrate to provide a catalyst template and then forming nanorods on the catalyst template by using the reactants in a liquid or vapor state in order to form the nanorods in a pattern on the substrate.

In a non-limiting exemplary embodiment, the nanorods can be formed through a low-temperature process (e.g., a liquid phase process carried out at about 18° C. to about 100° C. or about 18° C. to about 90° C.). Such a low-temperature process can avoid forming defects on a substrate that can occur during a high-temperature process. This allows the use of a substrate and facilitates the overall process.

Non-limiting examples of the substrate include a gallium nitride substrate, a glass substrate, a plastic substrate, an indium tin oxide ("ITO") layer-coated glass substrate an ITO layer-coated plastic substrate and combinations thereof. Although the substrate type is not limited, different conditions can be applied for etching the nanorods depending on the substrate type.

In non-limiting exemplary embodiments, external characteristics of the grown nanorods can correspond to those of the nanotubes. This means that it is possible to control the external characteristics of the nanotubes indirectly by controlling the external characteristics of the nanorods during the growth of the nanorods. Meanwhile, as further described below, internal characteristics of the nanotubes can be controlled during the etching. This allows for easy control of the characteristics of the nanotubes.

For example, as described above, the external characteristics of the nanotubes can include the diameter, length, aspect ratio, orientation, density, uniformity, etc. Such external characteristics of the nanotubes can be controlled not directly during the growth of the nanotubes but indirectly by controlling the external characteristics of the nanorods, for example, by controlling the diameter, length, aspect ratio, orientation, density, uniformity, etc. of the nanorods during the growth of the nanorods. The external characteristics of the nanorods can correspond to the external characteristics of the nanotubes as long as the external characteristics of the nanorods are not affected during the etching.

With use of the etching method for preparing nanotubes from nanorods as described herein, various types of difficulties that can occur during the direct growth of nanotubes can be avoided or reduced. Such difficulties can include: random growth of nanotubes (e.g., growth of a plurality of nanotubes in random directions on a contact surface between the substrate and nanotubes); non-uniformity in shapes or orientations of the nanotubes (e.g., growth of nanostructures having a shape other than a tube or a change in the growth direction, thereby failing to maintain a constant growth direction); a short aspect ratio of the nanotubes (e.g., less than about 10 or about 2-3); an excessive increase in the nanotube diameter (e.g., nanotubes having a diameter of about 1 micrometer or more); difficulty in controlling the thickness of the nanotubes (e.g., difficulty in controlling the wall thickness to about 200 nm or less or about 50 nm or less); difficulty in controlling the density of the nanotubes (e.g., difficulty in obtaining an adequate number of nanotubes per unit area); a relatively long growth time for obtaining the nanotubes; use of a high-temperature heat treatment process, expensive equipment or materials; difficulty in growing the nanotubes on a large scale; poor crystallinity of the grown nanotubes; and the like.

Non-limiting examples of parameters that can be adjusted to control the external characteristics of the nanorods include amount (number of nanotubes), density (amount per unit area of a substrate), size of the catalyst or nanoseed for growing the nanorods, which can be from about 5 nm to about 1 micrometer, nanorod growth temperature, which can be from about 18 to about 300° C., nanorod growth time, which can be from about 10 minutes to about 24 hours, amount or concentration of reactants for growing the nanorods, which can be from about 0.001 molar to about 1 molar, crystal structure of a substrate, surface roughness of a substrate, surface roughness of a seed layer for growing the nanorods, alignment degree of a template for growing the nanorods and amount or flow rate (velocity of flow) of a carrier gas for carrying the reaction source. The external characteristics of the nanotubes correspond to those of the nanorods, provided that the etching does not alter the external characteristics.

For example, in a liquid phase process for growing nanorods, the size of a catalyst or nanoseed, growth temperature, growth time amount or concentration of reactants, or the like or a combination thereof can be adjusted to control the diameter or length of the nanorods or a combination thereof. In particular, the diameter and length of the nanorods can increase as the size of the catalyst or nanoseed increases, the growth temperature increases, the growth time increases, the amount or concentration of the reactants increases or a combination thereof. In the liquid process, size of the catalyst or nanoseed can be from about 5 nm to about 1 micrometer, the nanorod growth temperature can be from about 18 to about 300° C., nanorod growth time can be from about 10 minutes to about 24 hours, and the amount or concentration of reaction source can be from about 0.001 molar to about 1 molar.

Further, for example, growth of nanorods comprising a piezoelectric material can occur relatively strongly along the direction of the c-axis. Thus, the growth temperature, the growth time, and/or the amount or concentration of the reactants can be increased to enhance the reaction rate, which can confer an increased aspect ratio on the nanorods.

Growth of one nanorod on one contact surface, the orientation of the one or more nanorods or a combination thereof can depend on the crystal structure of a substrate, the surface roughness of a substrate or seed layer or a combination thereof. A higher surface roughness of the substrate or seed layer or a more non-uniform crystal structure of a substrate on which the nanorods grow can result in more random growth of the nanorods. Furthermore, as the lattice misfits of the substrate is smaller, the nanorods can grow more uniformly in a vertical direction. For reference, the surface roughness of the seed layers is affected by the condition when the seed layers are formed. If the seed layer is formed using spin coating, the rotation speed and roughness of the seed layer may be in inverse proportion. If the seed layer is formed using dip coating, the roughness of the seed layer may depend on the type of solutions, for example, where absolute ethanol with high purity is used, the roughness of the seed layer may be low.

The density or uniformity of the nanorods can depend on the amount, density or size of a catalyst or nanoseed, or growth temperature. That is, as the amount or density of the catalyst or nanoseed increases, the amount or density of the grown nanorods can increase. A non-uniform size of the catalyst or nanoseed can result in reduced uniformity of grown nanorods. The growth temperature can be adjusted depending on the type of the material. The density or uniformity can be adjusted accordingly by control of the growth temperature. For example, in a low-temperature liquid phase process carried out at 100° C. or below (e.g., from about 18 to about 100° C.), the density or uniformity can be controlled by adjusting the temperature at 100° C. or below (e.g., from about 18 to about 100° C.). Furthermore, in the liquid phase process, the concentration of the catalyst or the seed can be from about 0.001 molar to about 1 molar.

In a vapor phase process, growth of one nanorod on one contact surface can depend on the crystal structure, the surface roughness of a substrate or a combination thereof. The uniformity or density can be controlled, for example, by adjusting the amount, density or size of a catalyst metal. The diameter, length, aspect ratio, density or uniformity of the nanorods can be controlled by adjusting the growth temperature or growth time. In a vapor phase process, parameters such as the aspect ratio, orientation or uniformity of the nanorods can also be controlled by adjusting the amount or flow rate of a carrier gas.

In a vapor-liquid phase process, the orientation of nanorods, or the growth of a nanorod on a contact surface can depend on the crystal structure or surface roughness of a substrate, or on the surface roughness of a seed layer. Also, the diameter, length, aspect ratio, density and uniformity of the nanorod can be controlled by adjusting the growth time, growth temperature, etc.

In a template process, the density, diameter, length, aspect ratio and uniformity of the nanorods can be controlled by adjusting the alignment degree (regularity in arrangement of pores) of a template such as an anodic aluminum oxide ("AAO") template.

In non-limiting exemplary embodiments, nanotubes can be prepared from nanorods comprising a piezoelectric material through selective etching as described hereinafter.

In a non-limiting exemplary embodiment, the selective etching can be carried out, for example, by dipping (immersing) the nanorods, for example the nanorods having the adjusted external characteristics into a tank containing a basic solution so that the nanorods are in contact with the basic solution.

As described above, the term "selective etching" means that the etching rate in a specific direction (e.g., a c-axis or longitudinal direction) of nanorods comprising a piezoelectric material is higher than the etching rates in the other directions. It should be understood that in some embodiments, although there can be a difference in the etching rates, etching can occur also in the other directions as well as in the specific direction.

The degree of etching can be controlled to accomplish the selective etching while maintaining the external characteristics of the nanotubes (i.e., avoiding or reducing changes in the external characteristics from the nanorods), ensuring that a tube shape is formed from the nanorods and preventing the formed nanotubes from being broken at the bottom parts thereof. As used herein, the degree of etching can also be referred to as a strength or rate of etching.

In a non-limiting example, at least one etching process parameter selected from the group consisting of the concentration of the basic solution, temperature of the basic solution and etching time can be adjusted to allow the external characteristics of the nanotubes to maintain the external characteristics of the nanorods. In addition, such etching process parameters can be adjusted to control the internal characteristics of the nanotubes including the wall thickness, tube depth, shape of the inner etched surface of the nanotubes and other similar characteristics.

For example, the degree of etching can be increased by increasing the concentration of the basic solution, temperature of the basic solution, etching time or a combination thereof. When the degree of etching is too low, it can be difficult to form a tube shape from the nanorods because the inner surfaces of the nanorods may not be sufficiently etched. In this case, the degree of etching can be adjusted to increase the degree of etching on the inner surfaces. Further, when the degree of etching is too high, it can be difficult to accomplish the selective etching while maintaining the external characteristics of the nanorods because the nanorods may be completely etched or over etched, or etched in other parts as well as on the inner surfaces of the nanorods.

In addition, if the degree of etching is too low or too high, the nanotubes may be broken at the bottom of the nanotubes in the vicinity of the contact surface between the nanotubes and the substrate. This is because the bottom of the nanotubes in the vicinity of the contact surface between the nanotubes and the substrate may be relatively weak compared to the other parts of the nanotubes. Therefore, one or more parameters such as the concentration of the basic solution, temperature of the basic solution, and etching time, or the like or a combination thereof can be adjusted in such a manner that the nanotubes stand firmly on the substrate while not being broken at the bottom.

Further, by controlling the degree of etching, the density of the nanotubes (i.e., number of the nanotubes per unit area) can also be controlled. It may also be possible to avoid or reduce variations in the external characteristics including the uniformity or orientation, diameter, length, aspect ratio, or the like. In an exemplary embodiment the degree of etching may be controlled by adjusting the concentration of the basic solution. In a specific embodiment, the base concentration can range from about 0.01 molar (M) to about 1 M, the etching temperature can range from about 18 to about 300° C. and the etching time can range from about 5 minutes to about 10 hours.

The concentration of the basic solution, temperature of the basic solution etching time, or the like or a combination thereof can be varied depending on the piezoelectric material, the type of basic solution, the type of substrate, etc. In an exemplary embodiment, the concentration of hydroxide ions in the basic solution can be from about 0.01 molar to about 1 molar, specifically from about 0.1 molar to about 0.6 molar, more specifically from about 0.1 molar to about 0.3 molar; the etching time can be from about 5 minutes to about 10 hours, specifically from about 15 minutes to about 6 hours, more specifically form about 1 hours to 5 hours; and the etching temperature can be from about 18 to about 300° C., specifically from about 70 to about 90° C., more specifically from about 70 to about 80° C. The external or internal characteristics can be controlled while monitoring them during the etching process with a scanning electron microscope ("SEM"), or other suitable methods.

In non-limiting exemplary embodiments, the etching with a basic solution can be performed at a low temperature of about 100° C. or less (e.g., about 18 to about 100° C., specifically about 60 to about 100° C.). Selective etching can be obtained as desired in the low-temperature etching process. Further, the low-temperature etching process can be combined with the above-mentioned low-temperature process for forming nanorods, resulting in an overall low-temperature process for preparing the nanotubes. Such an overall low-temperature process can prevent possible damage to or defects on a substrate compared to high temperature processes. This means that any available substrate such as a gallium nitride substrate, a glass substrate, a plastic substrate, an ITO layer-coated glass substrate, an ITO layer-coated plastic substrate or any combination thereof can be used in the process without the limitations due to high temperature.

In non-limiting embodiments, any piezoelectric materials having an asymmetric crystal structure and showing a higher polarity in a specific direction such as the c-axis or longitudinal direction compared to the other directions can be used.

For reference, crystals can be classified into 32 crystal groups based on their symmetry. Among the groups, 12 groups with a symmetric center can have no piezoelectricity. Among the remaining 20 groups, electrically non-conductive crystals can have a piezoelectric effect.

Non-limiting examples of the piezoelectric material having an asymmetric crystal structure can include but are not limited to: aluminum orthophosphate ($AlPO_4$), quartz, Rochelle salt, topaz, gallium orthophosphate ($GaPO_4$), lanthanum gallium silicate ($La_3Ga_5SiO_{14}$), barium titanate ($BaTiO_3$), bismuth titanate ($Bi_4Ti_3O_{12}$), lead titanate ($PbTiO_3$), zinc oxide (ZnO), zirconium lead titanate ("PZT"; $Pb[Zr_xTi_{1-x}]O_3$, $0<x<1$), lanthanum bismuth titanate ("BLT"; $[Bi_{4-x}La_x]Ti_3O_{12}$, $0<x<1$), tin oxide (SnO), potassium niobate ($KNbO_3$), lithium niobate ($LiNbO_3$), lithium tantalate ($LiTaO_3$), sodium tungstate ($Na_2WO_3$), sodium barium niobate ($Ba_2NaNb_5O_5$), potassium lead niobate ($Pb_2KNb_5O_{15}$), sodium potassium niobate ($KNaNb_5O_5$), bismuth ferrite ($BiFeO_3$) or the like. Zinc oxide or tin oxide may be used in the sense that they are easy to handle, easily available and harmless to human body.

For reference, barium titanate ($BaTiO_3$) can have a three-dimensional symmetric cubic structure (e.g., a=b=c=about 4.009 Å at about 130° C.) at about 130° C. or more. A shift from the cubic structure to an asymmetric tetragonal structure (extension in the direction of c-axis) can occur below 130° C. As the temperature drops, the c-axis length can increase relatively, thereby showing a piezoelectricity.

Any basic solution capable of generating hydroxide ions can be used as the basic solution, including strongly basic or weakly basic solutions. Further, inorganic basic solutions or organic basic solutions can be used. Non-limiting examples of the basic solution can include, but are not limited to: lithium hydroxide, sodium hydroxide, potassium hydroxide, rubidium hydroxide, cesium hydroxide, francium hydroxide, barium hydroxide, strontium hydroxide, calcium hydroxide, copper hydroxide, iron hydroxide, ammonium hydroxide, tetramethylammonium hydroxide, tetrabutylammonium hydroxide, choline hydroxide, alanine, phosphazene, histidine, imidazole, benzimidazole, purine, pyridine, pyridimine, methylamine or the like. The basic solutions can be used alone or in combination. The basic solution can be an aqueous basic solution or a non-aqueous basic solution. Nonaqueous solvents can include ethanol, methanol, acetone, chlorobenzene, or the like or a combination thereof.

Since the hydroxide ions in the basic solution can attack (react) along a specific direction such as the c-axis or longitudinal direction of the nanorods of a piezoelectric material to perform the selective etching, the use of a basic solution capable of producing a larger amount of hydroxide ions (i.e., a strong basic solution) can facilitate the selective etching of the nanorods. Non-limiting examples of the strong basic solution can include alkali metal hydroxides such as lithium hydroxide, sodium hydroxide, potassium hydroxide, rubidium hydroxide, cesium hydroxide, francium hydroxide, barium hydroxide, strontium hydroxide, other similar alkali metal hydroxides or combinations thereof.

Since the above-described method for preparing nanotubes of a piezoelectric material can include selective etching of the inner surfaces of nanorods of a piezoelectric material, the method allows for easy control of the characteristics of the nanotubes as compared to other methods of growing nanotubes. Additionally, processing conditions such as temperature or time can be easily controlled. In one exemplary embodiment, the processing time can be reduced, and a low-temperature process can be adopted, thereby avoiding limitations in the use of a substrate usually associated with a high-temperature process such as metal organic chemical vapor deposition.

In non-limiting exemplary embodiments, the nanotubes can have etched inner surfaces that are not formed by growing the nanotubes but formed by etching the nanorods. Such inner surfaces can have various shapes including curved surfaces or polygonal shapes. The inner spaces (voids) of the nanotubes formed by the etched surfaces can exist along a specific direction, which is the direction having a higher polarity than the other directions in the corresponding crystal structure. Further, the etched surface can be formed along the whole length of the nanotube extending from the top to the bottom. In this case, the depth of the nanotube can be equal to the length. In addition, the etched surface can be formed from the top of the nanotube to an intermediate point. In this case, the depth of the nanotube can be shorter than the length.

In an exemplary embodiment of a method for preparing the nanotubes on a substrate, the nanotubes can stand on the contact surface where the substrate (including a catalyst layer or seed layer when the substrate has a catalyst or nanoseeds) and the nanotubes are in contact with each other. In one embodiment, a plurality of nanotubes does not stand randomly on one contact surface. In another embodiment, only one nanorod is grown on one contact surface, and then the inner part of the nanorod can be selectively etched so that only one nanotube stands on one contact surface. Growing one nanorod on one contact surface can be accomplished more easily than growing one nanotube on one contact surface.

In non-limiting exemplary embodiments, the nanotubes of a piezoelectric material can be obtained by etching the nanorods of a piezoelectric material while maintaining the crystallinity of the nanorods. Thus, it is possible to prevent degradation of the crystallinity during the growth of the nanotubes. The crystallinity of the nanotubes may be one of the requirements taken into consideration when applying the nanotubes to various devices.

In a non-limiting example, a method for preparing zinc oxide nanotubes from zinc oxide nanorods will be explained in detail below.

For reference, zinc oxide can be a Group IIB-VIA compound semiconductor of the direct transition type having a broad band gap of about 3.37 eV at room temperature and can be a representative piezoelectric material. The crystal structure of zinc oxide can be classified into a hexagonal wurtzite crystal structure and a cubic zinc-blende crystal structure. The hexagonal wurtzite crystal structure can show piezoelectricity. The wurtzite crystal structure can be an asymmetric crystal structure.

Zinc oxide can have a relatively short distance in the c-axis as compared to the other distances between the ions. Therefore, zinc oxide can have an effective ionic charge ratio of about 1:1.2 and show a relatively high polarity in the direction of the c-axis, thereby exhibiting piezoelectricity.

Therefore, when hydroxide ions are provided to the zinc oxide nanorods, for example, by contacting the zinc oxide nanorods with a basic solution generating hydroxide ions, selective etching can occur along the direction of the c-axis with the higher polarity. The zinc oxide nanotubes can have etched inner surfaces that form the inner spaces in the nanotubes along the direction of the c-axis.

The above etching reaction can be represented by the following Reaction Scheme 1, when the basic solution is an aqueous solution.

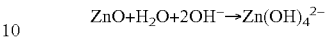
$ZnO+H_2O+2OH^- \rightarrow Zn(OH)_4^{2-}$

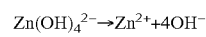
$Zn(OH)_4^{2-} \rightarrow Zn^{2+}+4OH^-$      Reaction Scheme 1

In a non-limiting example, the zinc oxide nanorods can be formed by using a liquid phase process, vapor phase process, liquid-vapor phase process, template process, other similar process or a combination thereof, and then the formed zinc oxide nanorods can be used to prepare the zinc oxide nanotubes by contacting the zinc oxide nanorods with the basic solution.

In a non-limiting example of the liquid phase process, a coating layer of a material (e.g., zinc acetate) that can enable nuclei growth of zinc oxide can be formed on a substrate to a small, uniform thickness (e.g., about 5 to about 50 nm) via spin coating or dip coating, and then the substrate can be subject to heating (e.g., to a temperature of about 100° C. or less, specifically about 18 to about 100° C., for a time of about 10 minutes to about 24 hours) and dried to form uniform nanonuclei, i.e., a seed layer. The substrate having the seed layer can be introduced into an aqueous solution (about pH 10) containing a zinc salt, such as zinc nitrate, zinc sulfate, zinc chloride or zinc acetate, and aqueous ammonia, and then heated (e.g., to a temperature of about 100° C. or less, specifically about 18 to about 100° C., for a time of about 10 minutes to about 24 hours) to grow the nanorods.

The basic condition of about pH 10 can provide a condition suitable for the growth of the zinc oxide nanorods. The aqueous ammonia can be used to form such a basic condition together with the zinc salt in such a manner that an aqueous basic solution with a pH of about 10 can be formed. The aqueous ammonia can also contribute to the growth of the nanorods. For reference, the above-described process for forming the nanorods can be represented by the following Reaction Scheme 2.

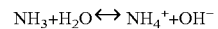
$NH_3+H_2O \leftrightarrow NH_4^++OH^-$

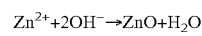
$Zn^{2+}+2OH^- \rightarrow ZnO+H_2O$

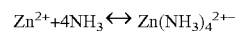
$Zn^{2+}+4NH_3 \leftrightarrow Zn(NH_3)_4^{2+}$

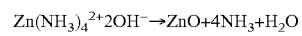
$Zn(NH_3)_4^{2+}+2OH^- \rightarrow ZnO+4NH_3+H_2O$      Reaction Scheme 2

As the size of the seeds increases, the nanorods grown therefrom can have a larger diameter or length. Further, a higher growth temperature, a longer growth time a larger amount or higher concentration of the zinc salt in the reaction source (i.e., the zinc salt solution from about 0.001 molar to about 1 molar) or a combination thereof can provide an increased diameter or length to the nanorods or a combination thereof. In addition, a higher growth temperature, a longer growth time a larger amount or higher concentration of the zinc salt in the reaction source (i.e., the zinc salt solution) or a combination thereof can provide a larger aspect ratio, while the diameter and length of the nanorods increase and the growth of the nanorods occurs principally in the direction of the c-axis. The growth temperature in the solution process can range from about 18 to about 300° C.

In one embodiment, the substrate can have a regular crystal structure to prevent random growth of the nanorods, and to control the orientation of the nanorods. The substrate or seed layer can have a decreased surface roughness to planarize the contact surface between the nanorods and the substrate or seed layer where the nanorods start to grow. The size of the seeds can range from about 5 nm to about 1 micrometer.

As the density of the seed layer increases, the nanorods grown from the seed layer can have a higher density. Further, a uniform nanoseed size can improve the uniformity of the nanorods.

In a non-limiting example of the vapor phase process, a reaction source, such as zinc or zinc oxide/graphite mixed powder, is loaded into a reaction furnace of a thermal chemical vapor deposition system, a substrate on which a catalyst (e.g., a catalyst metal such as Au, Co or Cu) is deposited is provided, and then the reaction source is heated on the substrate at a high temperature of about 700° C. to about 1200° C. to allow the catalyst and zinc gas to react with each other to grow the nanorods. Here, a carrier gas can be used to carry the reactants. Non-limiting examples of the carrier gas include Ar and Ne.

In a non-limiting example of the vapor phase process, the crystal structure or the surface roughness of the substrate or the surface roughness of the catalyst layer deposited on the substrate can be controlled to prevent random growth and to control the orientation of the nanorods. The uniformity or density can be controlled by adjusting the amount or density, size, growth temperature, growth time, or the like or a combination thereof of the catalyst metal. Also, the diameter, length or aspect ratio can be controlled by adjusting the growth temperature, growth time or a combination thereof. Since the carrier gas can carry the reactants in the vapor phase process, the aspect ratio, orientation, uniformity, or combination thereof of the nanorods can be controlled by adjusting the flow rate of the carrier gas. The flow rate of the carrier gas can range from about 50 to about 1000 standard cubic centimeters per minute (sccm). The catalyst metal can be selected from Au, In, Ag, Fe, Co, Ni and combinations thereof.

Non-limiting examples of the vapor-liquid phase process can include growing nanorods via spray pyrolysis. In the vapor-liquid phase process, water soluble materials (e.g., zinc acetate, zinc chloride, etc.) can be used as a reactant source, which can be dissolved in deionized water to be ionized. Then, ultrasonic pyrolysis can be performed to spray the reactants. The reactants can be transferred to a substrate by way of a carrier gas (e.g., Ar or $N_2$) to form nanorods on the substrate under oxygen atmosphere at about 400° C. or more.

In a non-limiting example of the vapor-liquid phase process, the crystal structure, the surface roughness of the substrate or a combination thereof can be controlled to prevent random growth, to control the orientation of the nanorods or a combination thereof. Also, the aspect ratio can be controlled by adjusting the growth time, growth temperature or combination thereof.

Non-limiting examples of the template process can include a process for preparing zinc oxide nanorods using an anodic aluminum oxide ("AAO") template.

For example, the aluminum surface can be planarized through electropolishing in advance to form an AAO template having a high alignment degree of regularly arranged pores by using bulk aluminum. Next, an acid solution (e.g., oxalic acid) can be used to perform primary anodization. Then, the AAO can be subjected to wet etching using an acid solution (e.g., mixed solution of chromic acid with phosphoric acid), followed by secondary anodization under the same condition to form an AAO nanotemplate having regularly arranged pores. A reaction source, a water-soluble zinc source (e.g., zinc chloride, zinc acetate, etc.), can be dissolved to be used as an electrolyte. Then, the pores of the AAO nanotemplate can be filled by electroplating and the template can be removed to form nanorods.

In exemplary template methods, the alignment degree of a template such as an AAO template or the like, as well as the reaction source, growth temperature, growth time, or the like, or combination thereof can be adjusted to control the density, aspect ratio and uniformity of the nanorods.

As described above, the zinc oxide nanotubes can be prepared by etching the zinc oxide nanorods selectively in the inner parts using a basic solution such as potassium hydroxide or ammonium hydroxide.

When carrying out the etching, the degree of etching can be controlled to perform selective etching while ensuring a tube shape from the nanorods and preventing the nanorods from being totally or etched in other parts in addition to the inner parts of the nanorods. Controlled etching prevents the formed nanotubes from being broken at the bottom parts and controlled etching prevents variations in the external characteristics of the nanotubes.

To control the degree of etching, the concentration of the basic solution, temperature, etching time, or the like or a combination thereof can be adjusted. For example, once the concentration of the basic solution is set, whether selective etching, excessive etching or complete etching occurs or not, and how long it takes to perform a suitable selective etching can be monitored while varying the temperature and etching time. Further, by varying the base set concentration, the same work can be performed. In this way, concentration, temperature and time conditions required to obtain an etching status as desired can be determined. Herein, the etching status can be monitored, for example, by scanning electron microscopy ("SEM"), etc. In a non-limiting exemplary embodiment using zinc oxide nanorods, the concentration of hydroxide ions in the basic solution can be from about 0.01 molar to about 1 molar, specifically from about 0.05 molar to about 0.6 molar, more specifically from about 0.1 molar to about 0.3 molar, the etching time can be from about 5 minutes to about 10 hours, specifically from about 30 minutes to about 8 hours, more specifically form about 1 hours to about 5 hours, and the etching temperature can be from about 18 to about 300° C., specifically from about 18 to about 100° C., more specifically from about 70 to about 90° C.

In a non-limiting exemplary embodiment, uniform zinc oxide nanotubes can be prepared on a large scale, where the nanotubes have an aspect ratio (of, e.g., about 10 or more, about 11 or more or about 12 or more), an orientation (e.g., an angle of about 45° to about 90°, about 60° to about 90° or about 80° to about 90° to a substrate), and a thinwall thickness (of, e.g., about 200 nm or less, about 1 nm to about 200 nm, about 20 nm to about 200 nm or about 20 nm to about 50 nm). For reference, the large scale can refer to a size of width and length of, for example, about 10 cm (centimeters) by about 10 cm. Since the etching can be performed by the contact with a basic solution, the size can vary depending on the size of the container in which the basic solution is contained.

Further, according to the above-described method, zinc oxide nanotubes can be prepared on a large scale, where one zinc oxide nanotube can stand on a contact surface between the substrate (including a catalyst layer or seed layer when the substrate has a catalyst or nanoseeds). In another embodiment, zinc oxide nanotubes with no randomly-grown nanotubes standing on one contact surface can be manufactured on large scale. The one or more zinc oxide nanotubes can be used for various devices such as current generating systems, solar cells, sensors, light emitting diodes ("LEDs"), electrochromic devices, or the like.

Hereinafter, as another non-limiting example, a method for preparing tin oxide (SnO) nanotubes from tin oxide nanorods will be explained in detail.

Tin oxide can be another representative piezoelectric material. The crystal structure of tin oxide can be classified into a cubic rutile crystal structure, which can be an asymmetric crystal structure, wherein the c-axis can show a higher polarity than the other directions, thereby showing piezoelectricity.

Therefore, when hydroxide ions are provided to the tin oxide nanorods, for example, by contacting the tin oxide nanorods with a basic solution generating hydroxide ions, selective etching can occur along the c-axis direction with a higher polarity. The tin oxide nanotubes can have etched inner surfaces to form a void therein. The inner spaces can be formed along the c-axis direction.

The above etching reaction can be represented by the following Reaction Scheme 3, when the basic solution is an aqueous solution.

$SnO + H_2O + OH^- \rightarrow Sn(OH)_4$

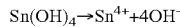
$Sn(OH)_4 \rightarrow Sn^{4+} + 4OH^-$      Reaction Scheme 3

In non-limiting exemplary embodiments, the tin oxide nanorods can be formed using a liquid phase process, vapor phase process, liquid-vapor phase process or template process, and then the formed tin oxide nanorods can be used to prepare the tin oxide nanotubes by contacting the tin oxide nanorods with the basic solution.

In a non-limiting example of the liquid phase process, a coating layer of a material (e.g., tin acetate) enabling seed growth of tin oxide can be formed on a substrate to a small, uniform thickness via spin coating, dip coating, or the like or a combination thereof, and then the substrate can be heated (e.g., to a temperature of about 100° C. or less) and dried to form uniform nanonuclei, i.e., a seed layer. The substrate having the seed layer can be introduced into an aqueous solution (about pH 10, concentration of about 0.001 molar to about 1 molar) containing a tin salt, such as tin nitrate, tin sulfate, tin chloride or tin acetate, and aqueous ammonia, and then heated (e.g., to a temperature of about 100° C. or less, specifically about 18 to about 100° C., for a time of about 10 minutes to about 24 hours) to grow the nanorods.

The basic condition of about pH 10 can provide a condition suitable for the growth of the tin oxide nanorods. The aqueous ammonia is used to form such a basic condition together with the tin salt in such a manner that an aqueous basic solution with a pH of about 10 is formed. That is, the aqueous ammonia can participate in the growth of the nanorods.

In the liquid phase process, parameters for controlling the diameter and length can include the size of the catalyst or nanoseeds, growth temperature, growth time, amount or concentration of the reactants, or the like or a combination thereof. That is, a larger size of the catalyst or seeds, a higher growth temperature, a longer growth time, a larger amount, higher concentration or a combination thereof of the reactants can provide an increased diameter or length to the nanorods. Further, a higher growth temperature, a longer growth time, a larger amount, higher concentration or a combination thereof of the reactants can provide an increased reaction rate, thereby providing a higher aspect ratio. The orientation, or growth of one nanorod on one contact surface can depend on the crystal structure of the substrate as well as on the surface roughness of the substrate or seed layer or a combination thereof. Since a high roughness or non-uniform crystal structure may likely result in random growth of nanorods, the substrate or seed layer can have a decreased surface roughness to planarize the contact surface and have a uniform crystal structure to prevent random growth.

The density and uniformity of nanorods can depend on the amount, density or size of a catalyst or nanoseed, growth temperature, or the like or a combination thereof. That is, as the amount or density of the catalyst or nanoseed increases, the amount or density of the grown nanorods can increase. A non-uniform size of the catalyst or nanoseed can result in reduced uniformity of the grown nanorods. The growth temperature can be different depending on the type of the material of the nanorod in a liquid phase process such as a low-temperature liquid phase process. The density, uniformity or a combination thereof can be controlled by adjusting the growth temperature.

In a non-limiting example of the vapor phase process, reactants, such as tin or tin oxide/graphite mixed powder, can be loaded into a reaction furnace of a thermal chemical vapor deposition system, and then the reactants are heated, for example, for example to a high temperature of about 500° C. to 1,500° C. to allow the growth of nanorods on a substrate via self-assemblage growth. A carrier gas can be used to carry the reaction source. Non-limiting examples of the carrier gas can include Ar, Ne or $N_2$.

In a non-limiting example of the vapor phase process, the orientation or growth of one nanorod on one contact surface can be controlled by adjusting the surface roughness, crystal structure of the substrate or a combination thereof. Further, the density, uniformity, diameter, length, aspect ratio or a combination thereof can be controlled by adjusting the growth temperature, growth time, the amount or rate of the reactants, carrier gas or a combination thereof.

Non-limiting examples of the vapor-liquid phase process can include growing nanorods via spray pyrolysis. In the vapor-liquid phase process, water soluble materials (e.g., tin acetate, tin chloride, etc.) can be used as reactants, which can be dissolved in deionized water to be ionized. Then, ultrasonic pyrolysis can be used to spray the reactants. The reactants can be transferred to a substrate by way of a carrier gas (e.g., Ar or $N_2$) to form nanorods on the substrate, e.g., under oxygen atmosphere at about 400° C. or more.

In a non-limiting example of the vapor-liquid phase process, the orientation, growth of one nanorod on one contact surface or a combination thereof can be controlled by adjusting the crystal structure, the surface roughness of the substrate or a combination thereof. Also, the diameter, length and aspect ratio can be controlled by adjusting the growth time, growth temperature or a combination thereof.

Non-limiting examples of the template process can include a process for preparing tin oxide nanorods using an AAO template.

For example, the aluminum surface can be planarized through electropolishing in advance to form an AAO template having a high alignment degree of regularly arranged pores by using bulk aluminum. Next, an acid solution (e.g., oxalic acid) can be used to perform primary anodization. Then, the AAO can be subjected to wet etching using an acid solution (e.g., mixed solution of chromic acid with phosphoric acid), followed by secondary anodization under the same condition to form an AAO nanotemplate having regularly arranged pores. Further, reactants such as a water soluble tin source (e.g., tin chloride, tin acetate, etc.) can be dissolved to be used as an electrolyte. Then, the pores of the AAO nanotemplate can be filled by electroplating and the template can be removed to form nanorods. The alignment degree of a template such as an AAO template can be adjusted to control the density, diameter, length, aspect ratio and uniformity of the nanorods.

The tin oxide nanorods can be subjected to selective etching in the inner parts thereof by using a basic solution such as potassium hydroxide, ammonium hydroxide and the like.

As explained above regarding the preparation of the zinc oxide nanotubes, when carrying out the etching, the degree of etching can be controlled to perform selective etching while assuring a tube shape from the nanorods, preventing the nanorods from being completely etched or etched in other parts as well as the inner parts of the nanorods, which prevents the formed nanotubes from being broken at the bottom and preventing variations in the external characteristics of the nanotubes.

To control the degree of etching, the concentration of the basic solution, temperature, etching time, or the like or a combination thereof can be adjusted. For example, once the concentration of the basic solution is set, whether selective etching, excessive etching or complete etching occurs or not, and how long it takes to perform a suitable selective etching can be monitored while varying the temperature and etching time. Further, by varying the basic concentration, the same work can be performed. In this way, concentration, temperature and time conditions required to obtain an etching status as desired can be determined. Herein, the etching status can be monitored, for example, by SEM, etc. In a non-limiting exemplary embodiment using tin oxide nanorods, the concentration of hydroxide ions in the basic solution can be from about 0.01 molar to about 1 molar, specifically from about 0.05 molar to about 0.8 molar, more specifically from about 0.1 molar to about 0.2 molar, the etching time can be from about 5 minutes to about 10 hours, specifically from about 30 minutes to about 8 hours, more specifically from about 1 hour to about 5 hours, and the etching temperature can be from about 18 to about 300° C., specifically from about 18 to about 100° C., more specifically from about 70 to about 80° C.

In a non-limiting exemplary embodiment, uniform tin oxide nanotubes can be prepared on a large scale, where the nanotubes have an aspect ratio (e.g., of about 10 or more, about 11 or more or about 12 or more), an orientation (e.g., an angle of about 45° to about 90°, about 60° to about 90° or about 80° to about 90° to a substrate), wall thickness (e.g. a thin wall thickness of about 200 nm or less, about 1 nm to about 200 nm, about 20 nm to about 200 nm or about 20 nm to about 50 nm). For reference, the large scale can refer to a size of width and length of, for example, about 10 cm by about 10 cm. Since the etching can be performed by the contact with a basic solution, the size can vary depending on the size of the container in which the basic solution is contained.

Further, according to the above-described method, tin oxide nanotubes can be prepared on a large scale, where a tin oxide nanotube may stand on a contact surface between the substrate (including a catalyst layer or seed layer when the substrate has a catalyst or nanoseeds) and nanotubes without randomly-grown nanotubes standing on a contact surface. The tin oxide nanotubes can be used for various devices such as current generating systems, solar cells, sensors, LEDs, electrochromic devices, or the like.

The examples and experiments will now be described. The following examples and experiments are for illustrative purposes only and not intended to limit the scope of the invention.

EXAMPLE 1

Preparation of Zinc Oxide Nanotubes on Gallium Nitride Substrate (1) Formation of Nanorods Nanorods having an aspect ratio of about 67.2 to about 11.2 (length of about 3.36 micrometers/diameter of about 50 to about 330 nm) and an angle of about 45° to about 90° to a gallium nitride substrate are prepared.

For example, the nanorods can be obtained as follows. A zinc acetate layer is formed uniformly on a gallium nitride substrate (about 10 cm×about 10 cm) having a uniform wurtzite crystal structure to a thickness of about 5 nm to about 20 nm via spin coating of zinc acetate solution (about 0.001 molar to about 1 molar). The substrate is heated to about 90° C. for about 20 minutes and dried to form nanoseeds.

The substrate having the nanoseeds is dipped into an aqueous solution containing about 25 mM zinc nitrate and aqueous ammonia dissolved therein and having a pH of about 10.

The aqueous solution containing the substrate is heated at about 90° C. for about 4 hours to grow the nanorods.

(2) Preparation of Nanotubes

The nanorods grown as described above are dipped into an aqueous potassium hydroxide (KOH) solution under the following concentration, temperature and time conditions, and are analyzed to determine if they are selectively etched or not through scanning electron microscopy (SEM) photographs.

FIGS. 2A-2I are SEM photographs showing the zinc oxide nanotubes etched under the etching conditions of Example 1.

The following etching conditions are performed.

Figure 2A:
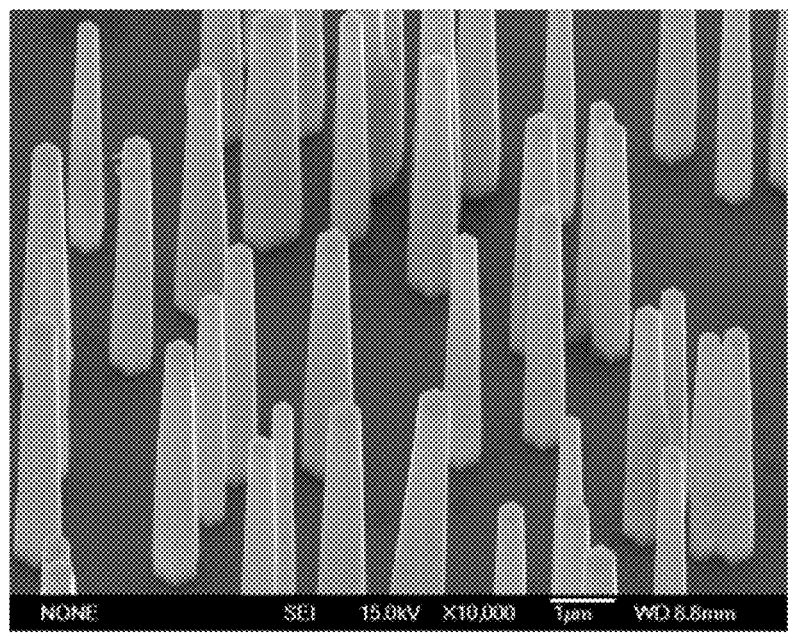
FIGS. 2A-2I are scanning electron microscope ("SEM") photographs of zinc oxide nanotubes according to etching conditions as described in Example 1.

(a) Etching is performed in about 0.1 M KOH at about 62° C. Because the temperature is too low, etching is minimal even after 5 hours, and thus the nanorods substantially maintain their shapes (refer to FIG. 2A). FIG. 2A is the photograph taken from an arbitrary portion of the nanorods.

Figure 2B:
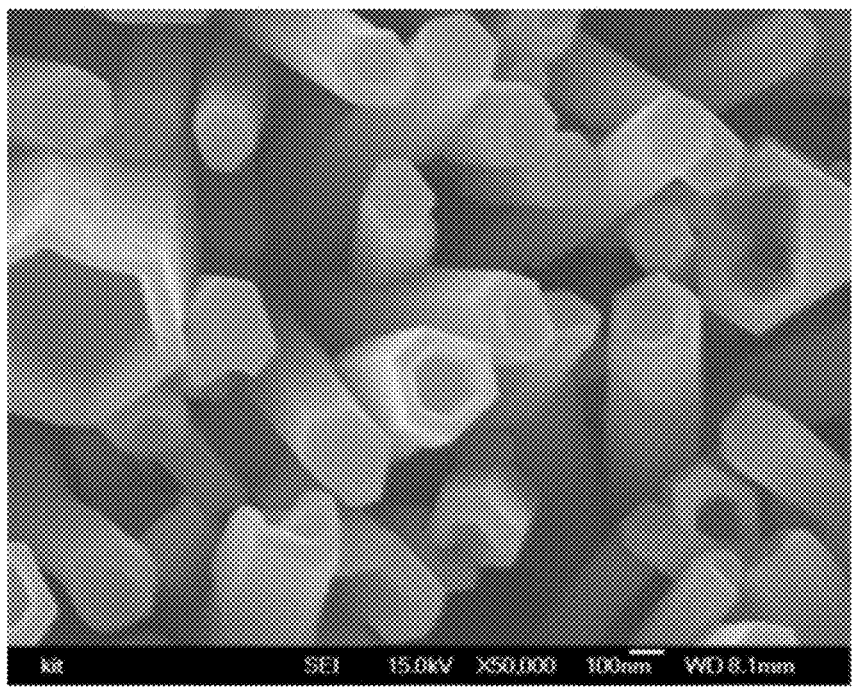

(b) Etching is performed in about 0.1 M KOH at about 72° C. Tube shapes appear after at least about 5 hours (refer to FIG. 2B). FIG. 2B is the photograph taken from an arbitrary portion. Due to a low etching rate, some of the nanotubes are tilted at their bottom parts.

Figure 2C:
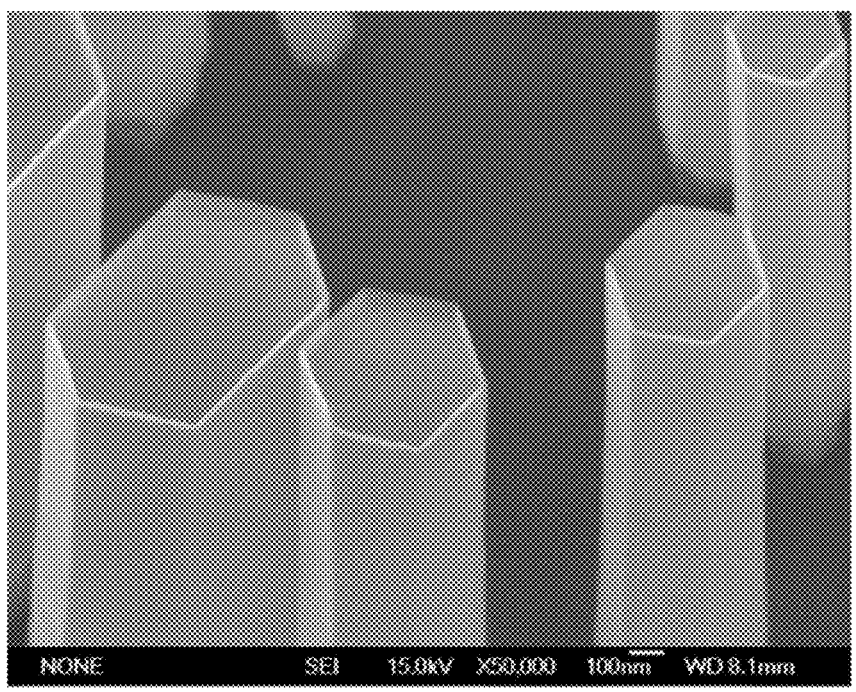
Figure 2D:
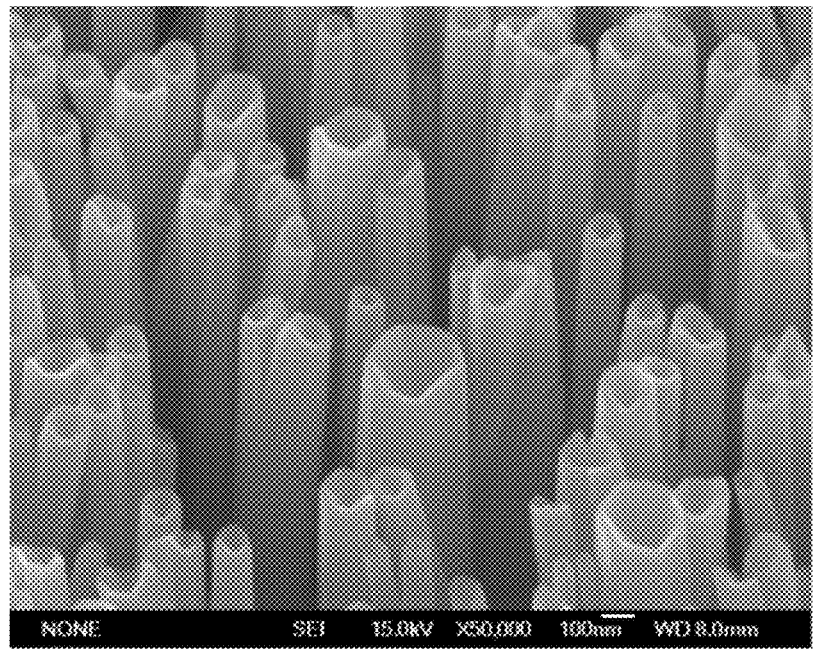
Figure 2E:
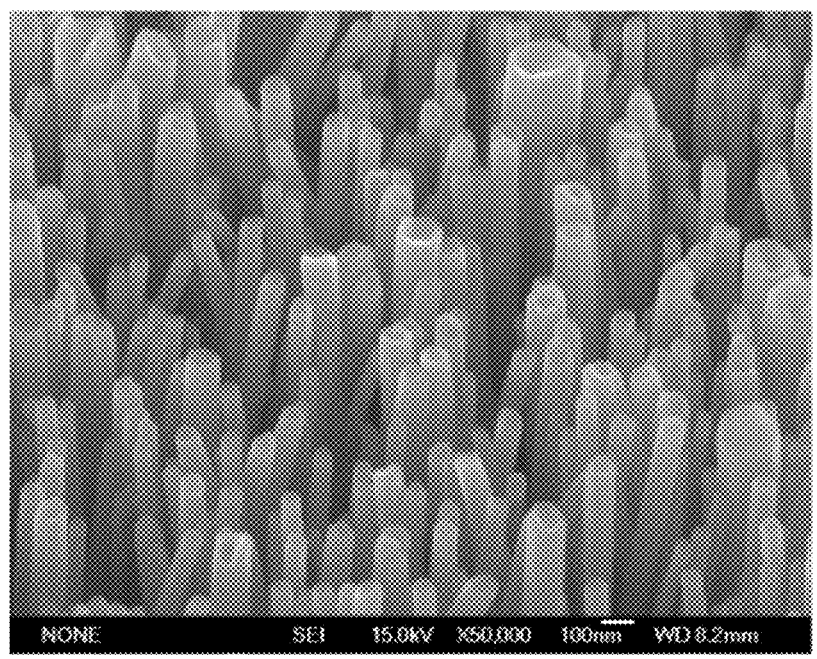
Figure 2F:
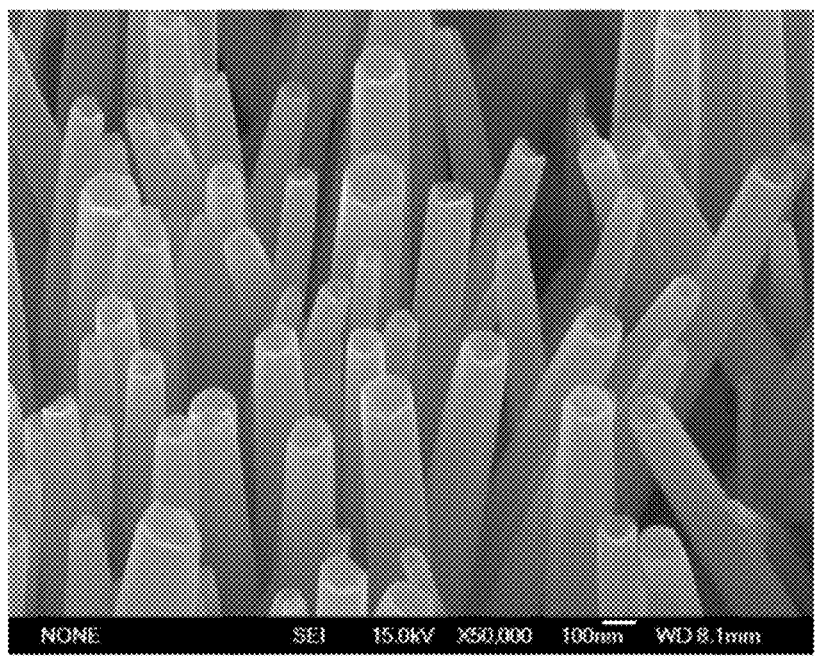

(c) Etching is performed in about 0.1 M KOH at about 80° C. Tube shapes appear after about 1 hour (FIG. 2C shows the nanotubes formed after about 1 hour, FIG. 2D shows the nanotubes formed after about 2 hours, and FIGS. 2E and 2F show the nanotubes formed after about 3 hours and about 4 hours, respectively). FIGS. 2C-2F are photographs taken from an arbitrary portion. FIG. 2C shows the nanorods beginning to be shaped into the nanotubes. FIGS. 2D-2F demonstrate that nanotubes are substantially formed from the nanorods. The formed nanotubes have an angle of about 45° to about 90° to the substrate and an aspect ratio of about 67.2 to about 11.2 (length of about 3.36 micrometers/diameter of about 50 to about 330 nm).

Figure 2G:
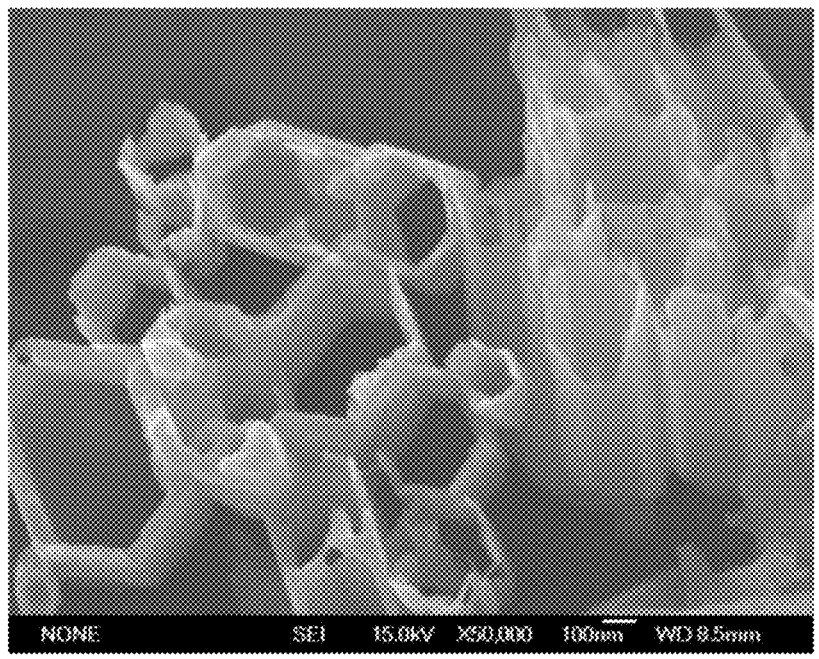

(d) Etching is performed in about 0.1 M KOH at about 90° C. for about 2 hours. Because the temperature is too high, excessive etching occurs and adversely affects the external characteristics of the nanotubes (refer to FIG. 2G). FIG. 2G is the photograph taken from an arbitrary portion of the formed nanotubes, which has undergone variations in the external characteristics.

Figure 2H:
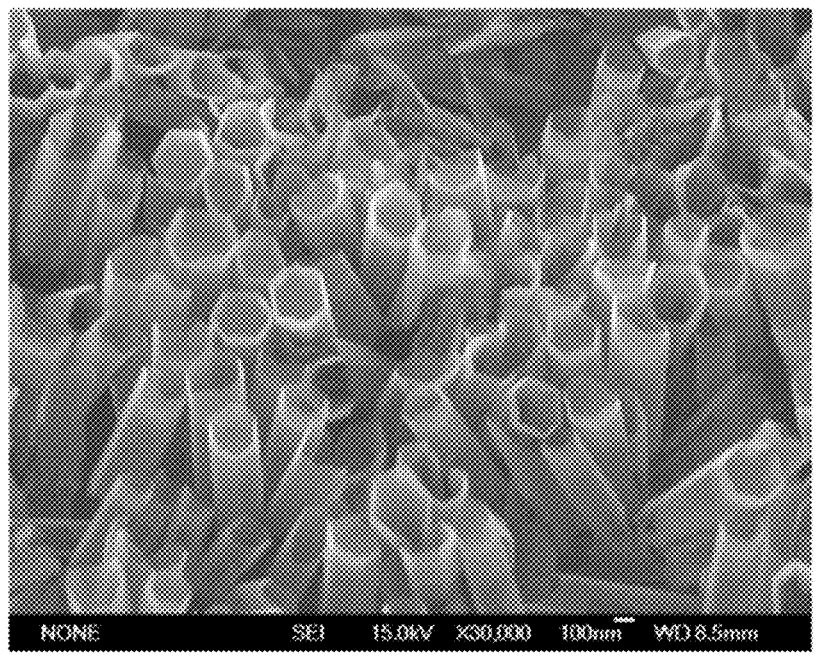

(e) Etching is performed in about 0.2 M KOH at about 80° C. Tube shapes appear after about 1 hour (refer to FIG. 2H). FIG. 2H is the photograph taken from an arbitrary portion of the formed nanotubes, where the external characteristics of the nanotubes are somewhat affected and, for example, some of the nanotubes are tilted. The external characteristics appear to be affected by the concentration of the basic solution.

Figure 2I:
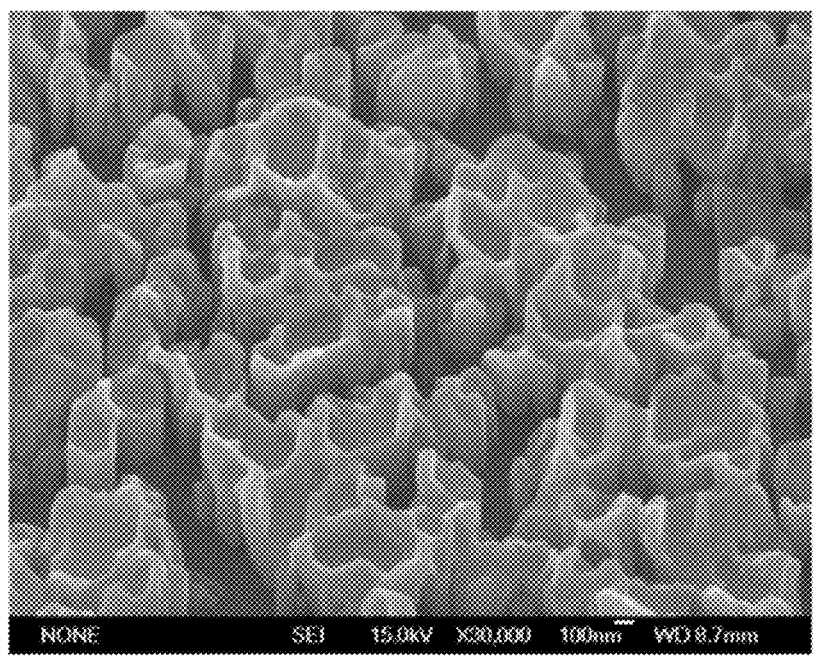

(f) Etching is performed in about 0.3 M KOH at about 80° C. for about 2 hours. After about 2 hours, completely etched parts appear (refer to FIG. 2I). FIG. 2I is the photograph taken from an arbitrary portion of the nanotubes, which are completely etched.

By varying the etching conditions as described above, the etching conditions required for preparing zinc oxide nanotubes from zinc oxide nanorods on a gallium nitride substrate can be determined. That is, when an aqueous potassium hydroxide solution is used as an etching solution, zinc oxide nanotubes are obtained by controlling the concentration to about 0.1 M to about 0.3 M, the temperature to about 70° C. to about 90° C., and the etch time to about 1 hour to about 5 hours.

As seen from FIGS. 2A-2I, it is observed that the obtained zinc oxide nanotubes can have a vertical or nearly vertical orientation, high uniformity, and a large scale. Further, it is observed that the nanotubes can have an aspect ratio of about 67.2 to about 11.2 (length of about 3.36 micrometers/diameter of about 50 to about 330 nm) and an angle of about 45° to about 90° to the substrate similar to the starting nanorods.

In addition, it is also observed that the nanotubes have a wall thickness of about 200 nm or less (e.g., about 5 nm to about 200 nm).

Figure 3A:
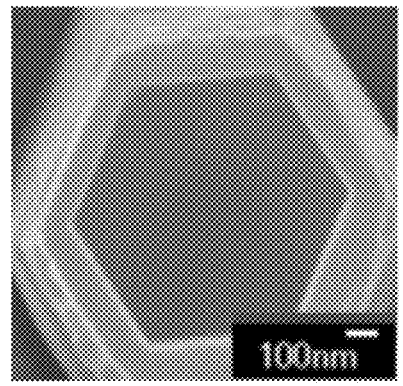
FIGS. 3A-3C are magnified SEM photographs of 4 (four) tubes sampled from the nanotubes as shown in FIG. 2C.
Figure 3B:
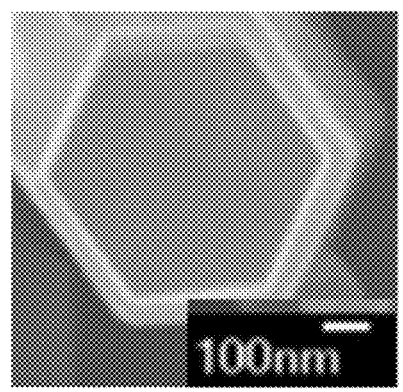
Figure 3C:
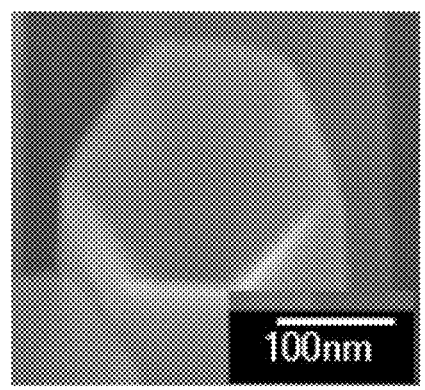

FIGS. 3A-3C are magnified SEM photographs of four tubes sampled from the nanotubes as shown in FIG. 2C. FIGS. 3A-3C show wall thicknesses of the nanotubes, which are from about 5 nm to about 200 nm.

EXAMPLE 2

Preparation of Zinc Oxide Nanotubes on ITO Layer-Coated Glass or Plastic Substrate (1) Formation of Nanorods Nanorods having an aspect ratio of about 67.2 to about 11.2 (length of about 3.36 micrometers/diameter of about 50 to about 330 nm) and an angle of about 45° to about 90° to an ITO layer-coated glass substrate are prepared.

Nanorods are also prepared in the same manner as with the glass substrate, but using a polyethersulfone ("PES") substrate. The results obtained from the two types of substrates are the same. This result suggests that because of the presence of the ITO coating layer, parameters such as the crystal structure, the surface configuration, and the material of the underlying substrate may not affect the characteristics of the nanorods or the nanotubes as much as the other parameters discussed above.

To prepare the nanorods, the same procedure as described in Example 1 is carried out, except that a glass substrate having a uniformly coated ITO layer is used instead of the gallium nitride substrate.

(2) Preparation of Nanotubes

The nanorods grown by the above procedure are dipped into an aqueous KOH solution under the following concentration, temperature and time conditions. The nanorods are analyzed to determine whether they are selectively etched or not through SEM photographs.

FIGS. 4A-4K are SEM photographs showing the zinc oxide nanotubes etched under the etching conditions of Example 2.

The following etching conditions are performed.

Figure 4A:
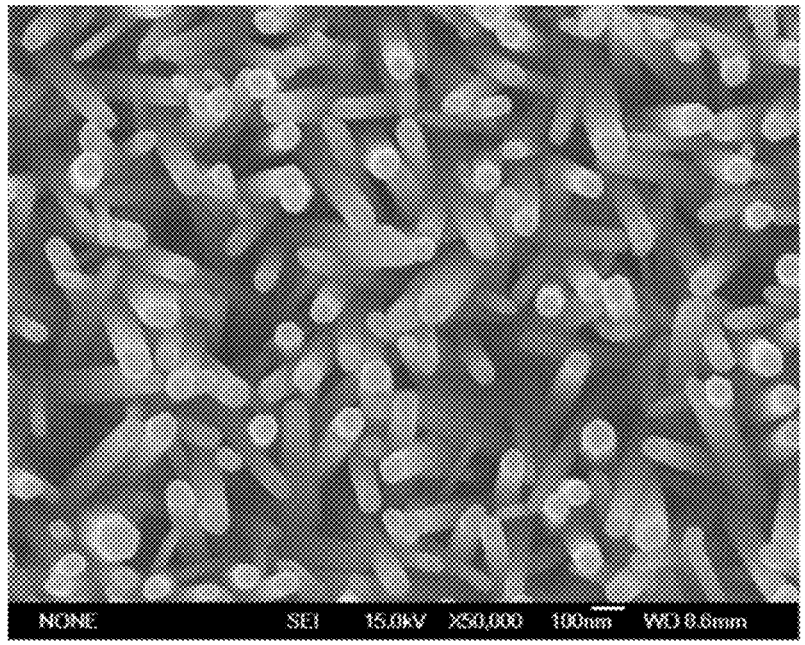
FIGS. 4A-4K are SEM photographs of zinc oxide nanotubes according to the etching conditions as described in Example 2.

(a) Etching is performed in about 0.05 M KOH at about 36° C. Because the temperature is too low, etching is minimal even after about 15 hours or more, and the nanorods substantially maintain their shapes (refer to FIG. 4A). FIG. 4A is the photograph taken from an arbitrary portion.

Figure 4B:
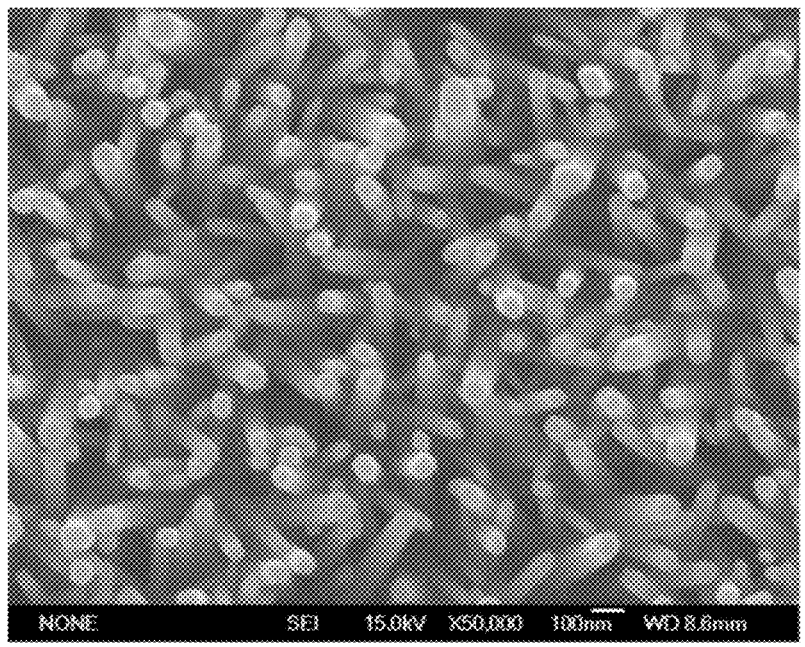

(b) Etching is performed in about 0.05 M KOH at about 62° C. Because the temperature is too low, etching is minimal even after about 15 hours or more, and the nanorods substantially maintain their shapes (refer to FIG. 4B). FIG. 4B is the photograph taken from an arbitrary portion.

Figure 4C:
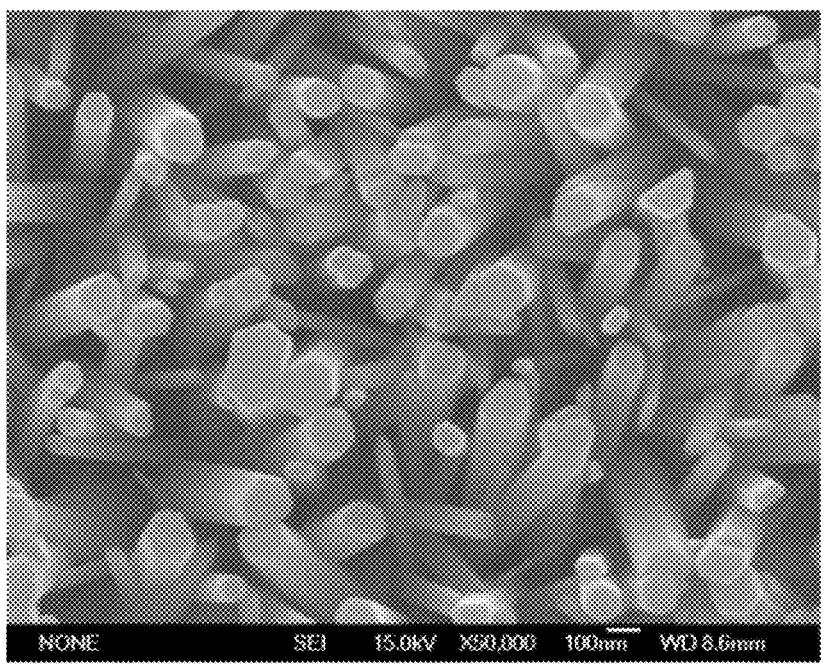

(c) Etching is performed in about 0.05 M KOH at about 78° C. Because the temperature is too low, etching is minimal even after about 15 hours or more, and the nanorods substantially maintain their shapes (refer to FIG. 4C). FIG. 4C is the photograph taken from an arbitrary portion.

Figure 4D:
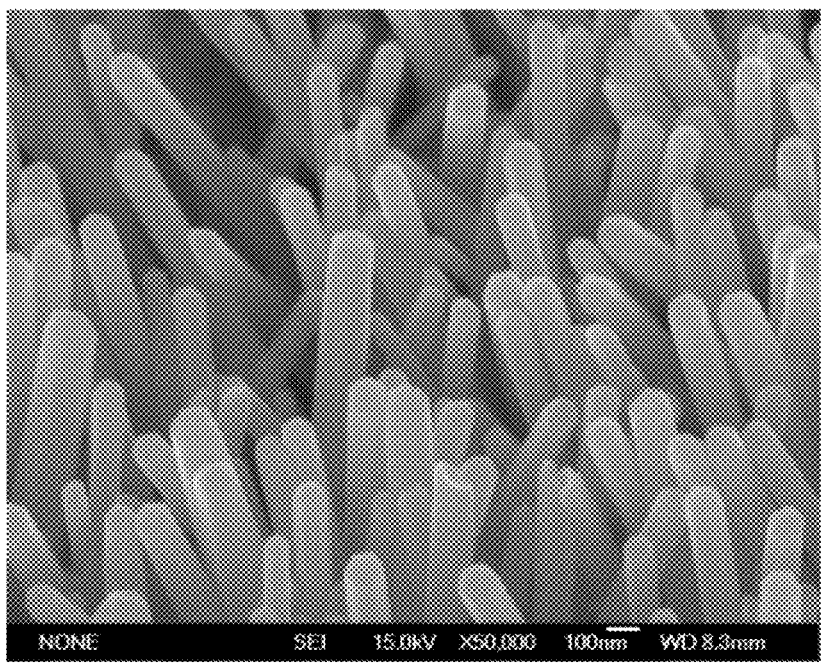

(d) Etching is performed in about 0.1 M KOH at about 80° C. Under these conditions, 1 hour does not appear to be sufficient to form nanotubes through selective etching (refer to FIG. 4D). FIG. 4D is the photograph taken from an arbitrary portion.

Figure 4E:
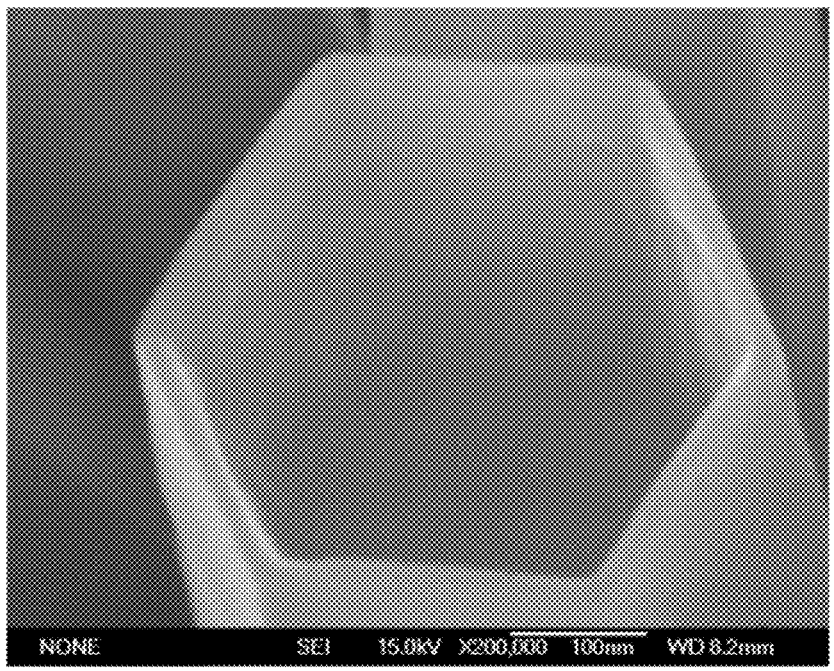

(e) Etching is performed in about 0.1 M KOH at about 70° C. Tube shapes appear after about 2 hours (refer to FIG. 4E). FIG. 4E is a magnified photograph of the corresponding nanotubes, and shows the shapes of the inner etched surfaces of the nanotubes.

Figure 4F:
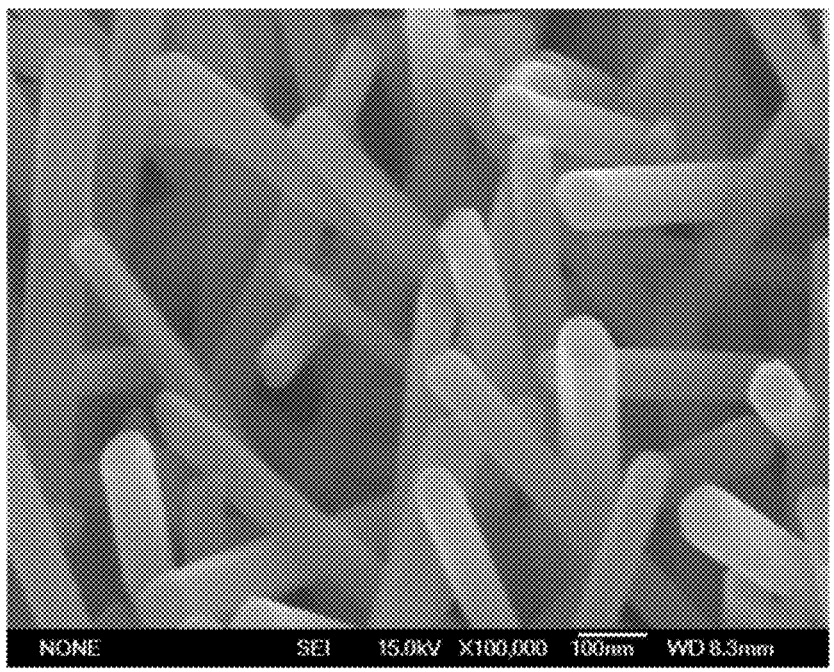

(f) Etching is performed in about 0.125 M KOH at about 70° C. for about 1 hour. These etching conditions do not appear to be sufficient to form the nanotubes (refer to FIG. 4F). FIG. 4F is the photograph taken from an arbitrary portion.

Figure 4G:
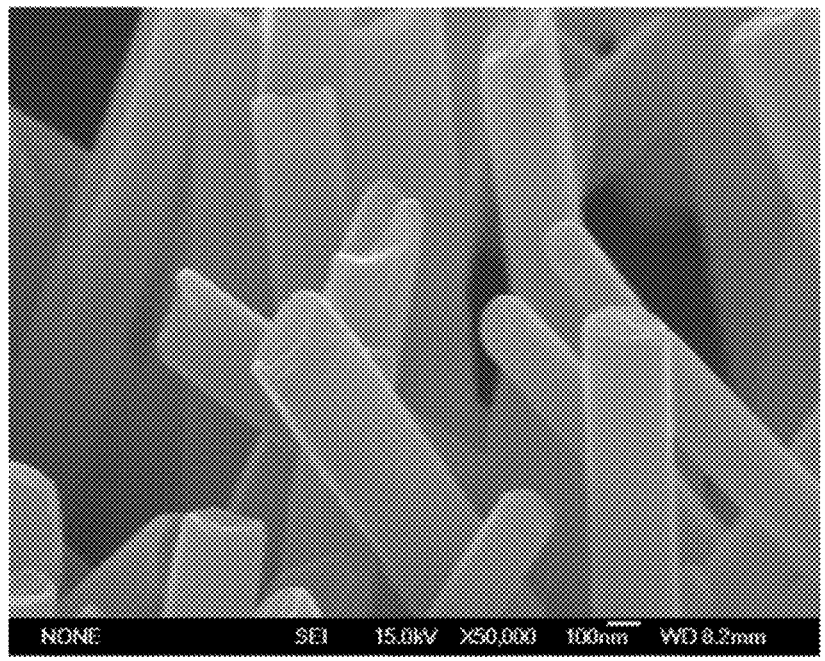

(g) Etching is performed in about 0.125 M KOH at about 70° C. for about 1.5 hours. Under such etching conditions, the nanorods begin to be shaped into nanotubes (refer to FIG. 4G). FIG. 4G is the photograph taken from an arbitrary portion.

Figure 4H:
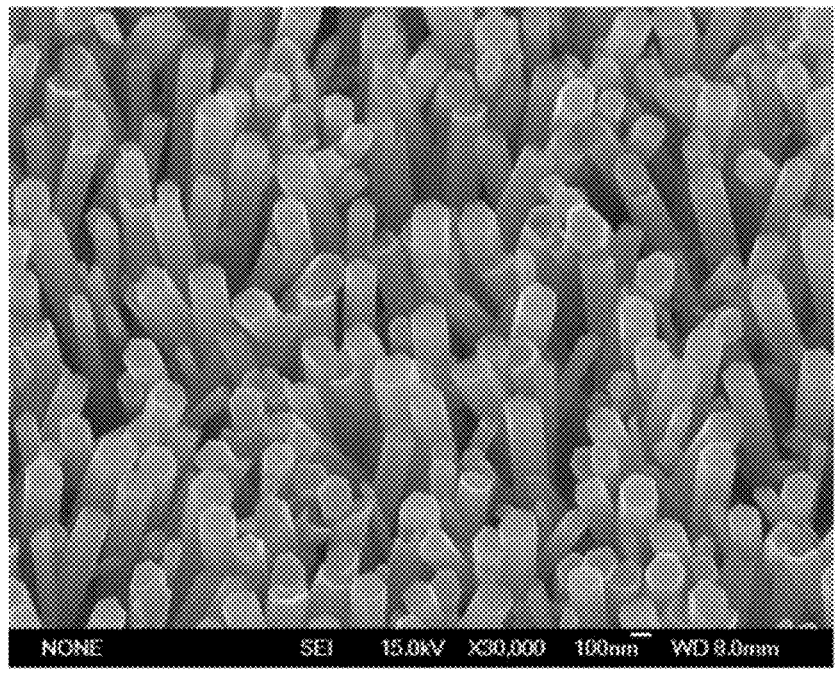

(h) Etching is performed in about 0.2 M KOH at about 70° C. for about 1 hour. Nanotubes are formed under such etching conditions (refer to FIG. 4H). FIG. 4H is the photograph taken from an arbitrary portion.

Figure 4I:
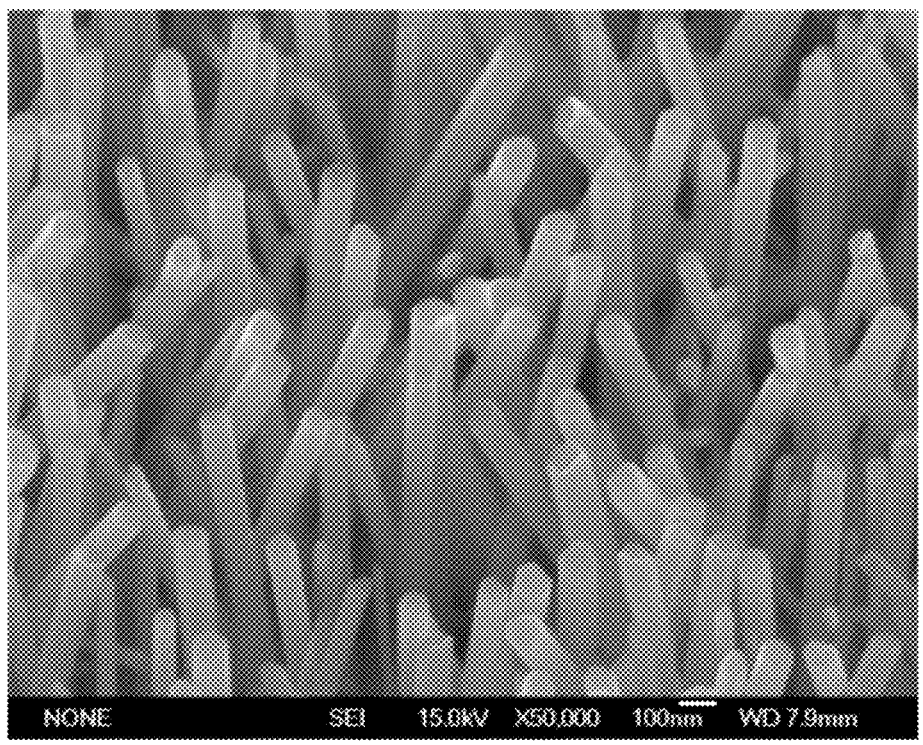

(i) Etching is performed in about 0.2 M KOH at about 80° C. for about 2 hours. Nanotubes are formed under such etching conditions (refer to FIG. 4I). FIG. 4I is the photograph taken from an arbitrary portion.

Figure 4J:
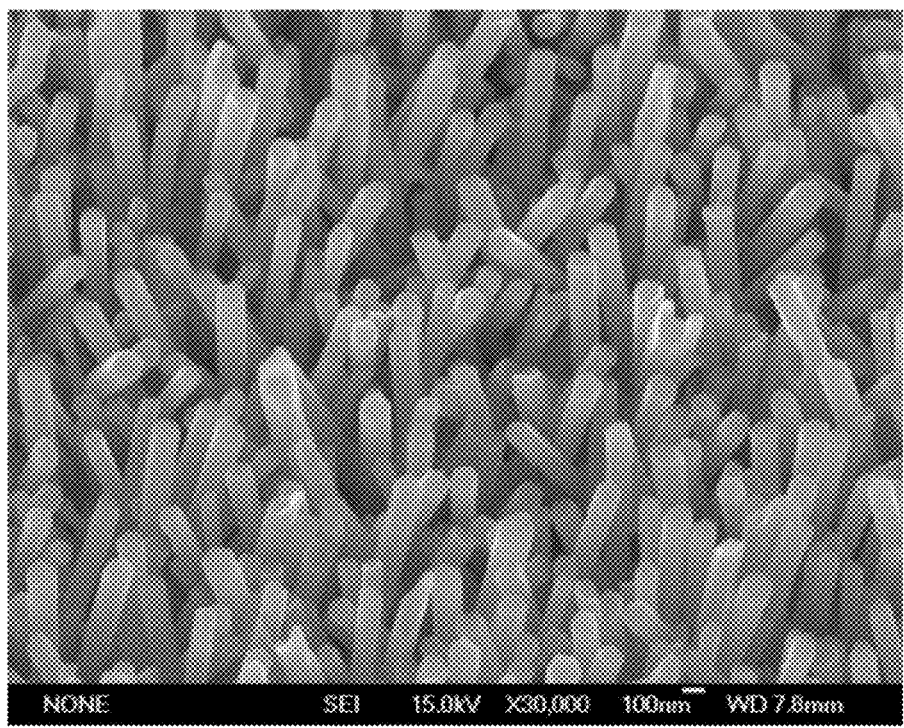

(j) Etching is performed in about 0.2 M KOH at about 70° C. for about 4 hours. Nanotubes are formed under such etching conditions (refer to FIG. 4J). FIG. 4J is the photograph taken from an arbitrary portion.

Figure 4K:
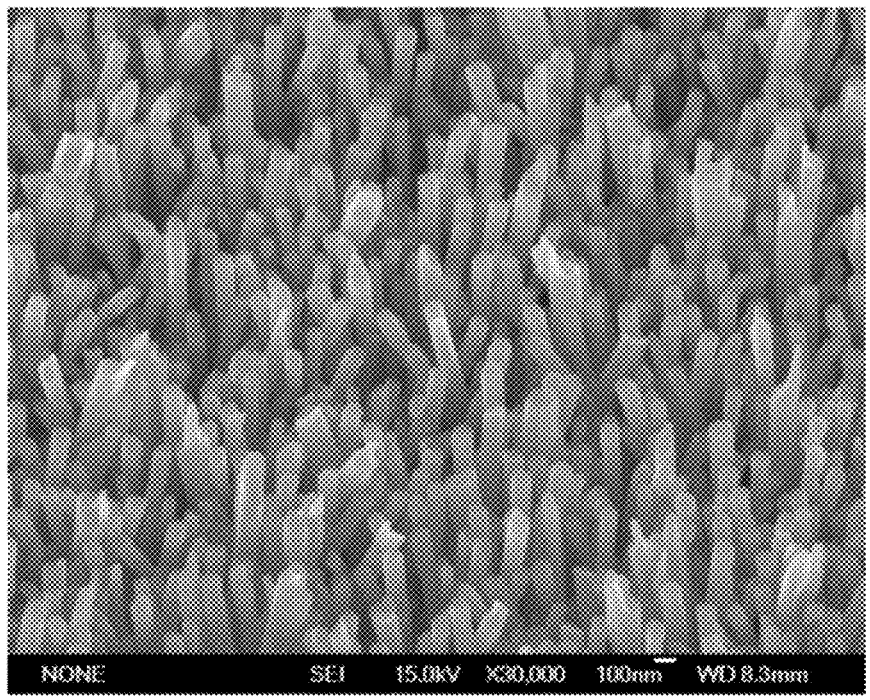

(k) Etching is performed in about 0.2 M KOH at about 70° C. for about 5 hours. Nanotubes are formed under such etching conditions (refer to FIG. 4K). FIG. 4K is the photograph taken from an arbitrary portion.

Through the above procedure varying the etching condition, the etching conditions required for preparing zinc oxide nanotubes from zinc oxide nanorods on an ITO layer-coated glass substrate can be determined. When an aqueous potassium hydroxide solution is used as an etching solution, zinc oxide nanotubes are obtained by controlling the concentration to about 0.1 M to about 0.2 M, the temperature to about 70° C. to about 80° C., and the etch time to about 1 hour to 5 hours.

As seen from FIGS. 4A-4K, it is observed that the zinc oxide nanotubes have a vertical or nearly vertical orientation, high uniformity, and a large scale. Further, it is observed that the nanotubes have an aspect ratio of about 67.2 to about 11.2 (length of about 3.36 micrometers/diameter of about 50 to about 330 nm) and an angle of about 45° to about 90° to the substrate similar to the starting nanorods. In addition, it is also observed that the nanotubes have a wall thickness of about 5 nm to about 200 nm (refer to FIG. 4E).

EXAMPLE 3

Preparation of Zinc Oxide Nanotubes on ITO Layer-Coated Glass Substrate (nanorods prepared via the dipping process)
(1) Formation of Nanorods In the same manner as described in Example 2, nanorods having an aspect ratio of about 67.2 to about 11.2 (length of about 3.36 micrometers/diameter of about 50 to about 330 nm) and an angle of about 45° to about 90° to an ITO layer-coated glass substrate are prepared. In this example, a seed layer for forming the nanorods is obtained via a dipping process instead of a spin coating process.

A gallium nitride substrate (about 10 cm×about 10 cm) having a wurtzite crystal structure is dipped into an aqueous zinc acetate solution (concentration of about 0.001 molar to about 1 molar) for about 60 seconds to form a seed layer to a uniform thickness of about 5 nm to about 20 nm. Next, the substrate is heated to about 90° C. for about 20 minutes and dried.

(2) Preparation of Nanotubes

The nanorods grown by the above procedure are dipped into an aqueous KOH solution to form the nanotubes. Similarly to Example 2, the zinc oxide nanotubes are obtained by controlling the concentration of the aqueous solution to about 0.1 M to about 0.2 M, the temperature to about 70° C. to about 80° C., and the etch time to about 1 hour to about 5 hours.

Figure 5A:
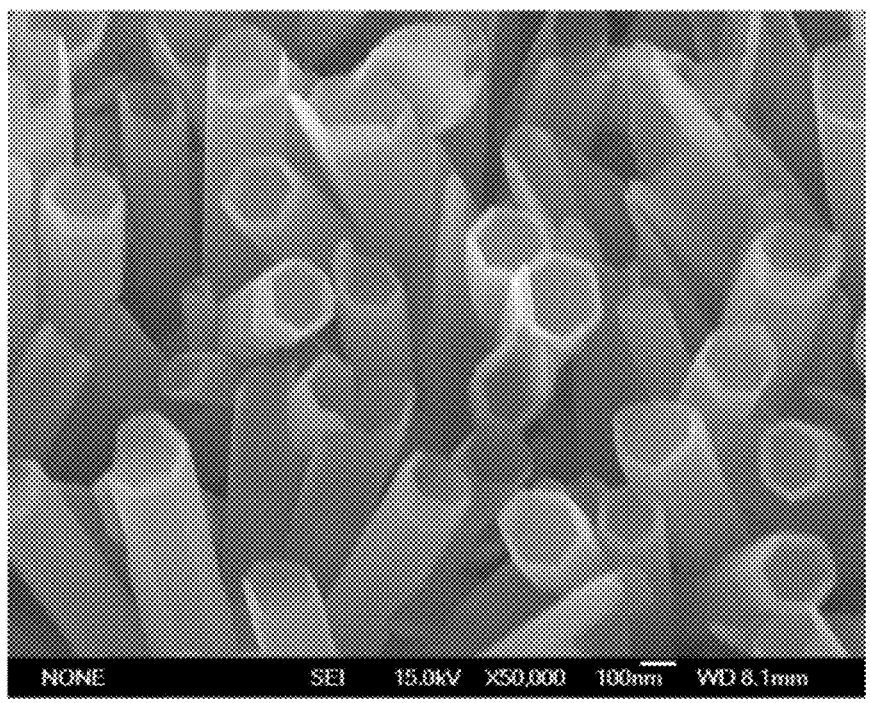
FIGS. 5A and 5B are SEM photographs of zinc oxide nanotubes according to two different etching conditions as described in Example 3.
Figure 5B:
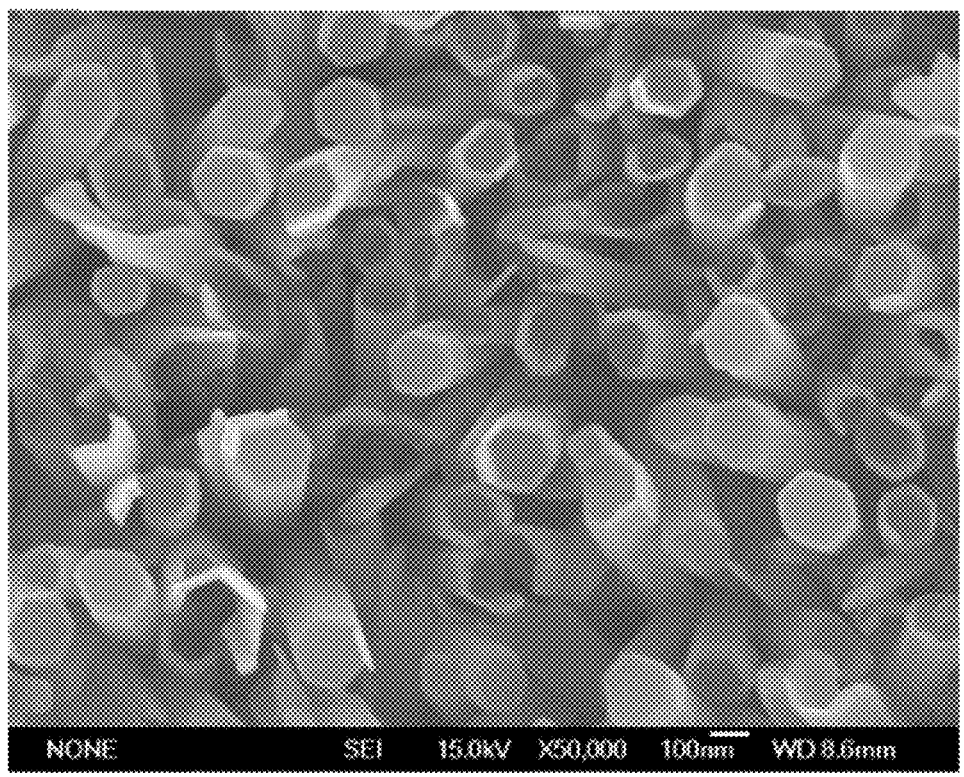

For reference, FIGS. 5A and 5B are SEM photographs of the zinc oxide nanotubes obtained under two different etching conditions [(1) about 0.2 M, about 80° C., about 4 hours (refer to FIG. 5A), and (2) about 0.2 M, about 80° C., about 5 hours (refer to FIG. 5B)] in Example 3, to provide sufficient etching. FIGS. 5A and 5B are taken from an arbitrary portion. As seen in FIGS. 5A and 5B, the zinc oxide nanotubes are formed from the zinc oxide nanorods.

While the exemplary embodiments have been shown and described, it will be understood by those skilled in the art that various changes in form and details may be made thereto without departing from the spirit and scope of the present invention as defined by the appended claims.

In addition, many modifications can be made to adapt a particular situation or material to the teachings of the invention without departing from the essential scope thereof. Therefore, it is intended that the present invention not be limited to the particular exemplary embodiments disclosed as the best mode contemplated for carrying out this invention, but that the present invention will include all embodiments falling within the scope of the appended claims.

What is claimed is:

1. A method for preparing nanotubes comprising:
forming nanorods comprising a piezoelectric material having an asymmetric crystal structure by a vapor phase process, a vapor-liquid process or a template process; and
providing hydroxide ions to the nanorods to etch at least a portion of an inner part of the nanorods to form the nanotubes,
wherein the vapor phase process comprises
providing a first substrate having a catalyst disposed thereon,
heating the substrate to about 700° C. to about 1200° C., and
contacting the heated substrate with a precursor of the piezoelectric material to form the nanorods,
wherein the vapor-liquid process comprises
providing a solution comprising a precursor of the piezoelectric material, and
contacting a second substrate with the solution under an oxygen atmosphere at about 400° C. or more to form the nanorods, and
wherein the template process comprises
providing an anodic aluminum oxide template,
contacting the anodic aluminum oxide template with the solution comprising a precursor of the piezoelectric material,
electroplating the piezoelectric material in pores of the anodic aluminum oxide template, and
removing the anodic aluminum oxide template to form the nanorods.

2. The method according to claim 1, wherein the piezoelectric material is selected from the group consisting of aluminum orthophosphate ($AlPO_4$), quartz, Rochelle salt, topaz, gallium orthophosphate ($GaPO_4$), lanthanum gallium silicate ($La_3Ga_5SiO_{14}$), barium titanate ($BaTiO_3$), bismuth titanate ($Bi_4Ti_3O_{12}$), lead titanate ($PbTiO_3$), zinc oxide (ZnO), zirconium lead titanate (PZT; $Pb[Zr_xTi_{1-x}]O_3$, 0<x<1), lanthanum bismuth titanate (BLT; $[Bi_{4-x}La_x]Ti_3O_{12}$, 0<x<1), tin oxide (SnO), potassium niobate ($KNbO_3$), lithium niobate ($LiNbO_3$), lithium tantalate ($LiTaO_3$), sodium tungstate ($Na_2WO_3$), sodium barium niobate ($Ba_2NaNb_5O_5$), potassium lead niobate ($Pb_2KNb_5O_{15}$), sodium potassium niobate ($KNaNb_5O_5$), bismuth ferrite ($BiFeO_3$) and any combination thereof.

3. The method according to claim 1, wherein the nanorods are in contact with a basic solution comprising the hydroxide ions to etch the at least a portion of the inner part of the nanorods.

4. The method according to claim 3, wherein the basic solution comprises at least one material selected from the group consisting of lithium hydroxide, sodium hydroxide, potassium hydroxide, rubidium hydroxide, cesium hydroxide, francium hydroxide, barium hydroxide, strontium hydroxide, calcium hydroxide, copper hydroxide, iron hydroxide, ammonium hydroxide, tetramethylammonium hydroxide, tetrabutylammonium hydroxide, choline hydroxide, alanine, phosphazene, histidine, imidazole, benzimidazole, purine, pyridine, pyridimine, methylamine and any mixture thereof.

5. The method according to claim 3, wherein at least one parameter selected from the group consisting of a concentration of the basic solution, a temperature of the basic solution and an etching time is controlled during the contacting with the basic solution to perform the etching.

6. The method according to claim 5, wherein the contacting with the basic solution is performed at a temperature of about 100° C. or lower.

7. The method according to claim 3, wherein the nanorods are zinc oxide nanorods formed on a gallium nitride substrate, and the nanorods are contacted with an aqueous potassium hydroxide (KOH) solution to etch the at least a portion of the inner part of the nanorods, and concentration and temperature of the aqueous KOH solution and etching time are adjusted to about 0.1 M to about 0.3 M, to about 70° C. to about 90° C. and to about 1 hour to about 5 hours, respectively.

8. The method according to claim 3, wherein the nanorods are zinc oxide nanorods formed on an ITO layer-coated glass or plastic substrate, and wherein an aqueous potassium hydroxide (KOH) solution is utilized to etch the at least a portion of the inner part of the zinc oxide nanorods, and wherein concentration and temperature of the aqueous KOH solution and etching time are adjusted to about 0.1 M to about 0.2 M, to about 70° C. to about 80° C. and to about 1 hour to about 5 hours, respectively.

9. The method according to claim 3, wherein the nanorods are formed on a substrate.

10. The method according to claim 9, wherein the first substrate and the second substrate are each independently at least one substrate selected from the group consisting of a gallium nitride substrate, a glass substrate, a plastic substrate, an indium tin oxide layer-coated glass substrate, an indium-tin layer-coated plastic substrate and any combination thereof.

11. The method according to claim 9, further comprising controlling at least one external characteristic of the nanorods to control at least one external characteristic of the nanotubes.

12. The method according to claim 9, wherein at least one external characteristic of the nanorods is controlled by adjusting at least one parameter selected from the group consisting of an amount of catalyst, a density of catalyst, a size of catalyst, an amount of seeds, a density of seeds, a size of seeds, a growth temperature of the nanorods, a growth time of the nanorods, an amount of a reactant source, a concentration of a reactant source, a crystal structure of the substrate, a surface roughness of the substrate, surface roughness of a seed layer for growing the nanorods, an alignment degree of a template for growing the nanorods, an amount of a carrier gas, and a rate of a carrier gas for carrying the reactant.

13. The method according to claim 11, wherein the at least one parameter selected is from the group consisting of a concentration of the basic solution, a temperature of the basic solution, and a time of contact with the basic solution, and is adjusted to control a variation in the at least one external characteristic of the nanotubes, to control at least one inner characteristic of the nanotubes or a combination thereof.

14. The method according to claim 1, wherein nanonuclei or catalysts; and reactants are used in the vapor phase process and/or the vapor-liquid process.

15. The method according to claim 1, wherein a patterned catalyst is formed on a substrate and nanorods are formed on the catalyst by using reactants in the template process.

16. The method according to claim 1, wherein a concentration of the hydroxide ions is from about 0.01 molar to about 1 molar, the etching time is from about 5 minutes to about 10 hours, and the etching temperature is from about 18 to about 300° C.

17. The method of claim 1, wherein the forming nanorods comprises the vapor phase process.

18. The method of claim 1, wherein the forming nanorods comprises the vapor-liquid process.

19. The method of claim 1, wherein the forming nanorods comprises the template process.

* * * * *